(12) United States Patent
Shibazaki et al.

(10) Patent No.: US 9,706,190 B2
(45) Date of Patent: Jul. 11, 2017

(54) IMAGE PROCESSING APPARATUS AND IMAGE PROCESSING PROGRAM

(71) Applicant: NIKON CORPORATION, Tokyo (JP)

(72) Inventors: Kiyoshige Shibazaki, Higashimurayama (JP); Muneki Hamashima, Fukaya (JP); Susumu Mori, Tokyo (JP); Yumi Suzuki, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 716 days.

(21) Appl. No.: 14/047,269

(22) Filed: Oct. 7, 2013

(65) Prior Publication Data

US 2014/0036043 A1 Feb. 6, 2014

Related U.S. Application Data

(63) Continuation of application No. PCT/JP2012/002600, filed on Apr. 13, 2012.

(30) Foreign Application Priority Data

Apr. 14, 2011 (JP) .................................. 2011-090141

(51) Int. Cl.
*H04N 13/02* (2006.01)
*H04N 5/232* (2006.01)
*H04N 5/369* (2011.01)
*H04N 9/04* (2006.01)

(52) U.S. Cl.
CPC ..... *H04N 13/0257* (2013.01); *H04N 5/23212* (2013.01); *H04N 5/23274* (2013.01); *H04N 5/3696* (2013.01); *H04N 9/045* (2013.01); *H04N 13/0217* (2013.01)

(58) Field of Classification Search
None
See application file for complete search history.

(56) References Cited

U.S. PATENT DOCUMENTS

| 7,363,157 | B1* | 4/2008 | Hanna | G01C 11/00 |
| | | | | 702/5 |
| 2004/0169749 | A1* | 9/2004 | Acharya | H04N 5/33 |
| | | | | 348/279 |
| 2006/0066718 | A1* | 3/2006 | Yanagawa | H04N 13/0242 |
| | | | | 348/51 |
| 2007/0296721 | A1* | 12/2007 | Chang | G06T 15/10 |
| | | | | 345/427 |

FOREIGN PATENT DOCUMENTS

JP  A-8-47001  2/1996

OTHER PUBLICATIONS

International Search Report issued in International Patent Application No. PCT/JP2012/002600 dated Jul. 10, 2012.

* cited by examiner

*Primary Examiner* — Mohammed Rahaman
(74) *Attorney, Agent, or Firm* — Oliff PLC

(57) ABSTRACT

So as to obtain color parallax images, it has been necessary to prepare an image capturing optical system and an image capturing element that are complex, to capture the parallax images. In view of the above, provided is an image processing apparatus including: an image obtaining section; a disparity amount operation section; and an image converting section.

13 Claims, 19 Drawing Sheets

⟨1⟩n=2

| REPETITIVE PATTERN CLASSIFICATION | | EXISTENCE/NON-EXISTENCE OF PARALLAX PIXEL | | | PARALLAX PIXEL | PARALLAX ARRAY | CHARACTERISTICS |
|---|---|---|---|---|---|---|---|
| | | Gr | Gb | R, B | | | |
| CLASSIFICATION A | A-1 | EXIST | EXIST | NOT EXIST | Gr AND Gb ALTERNATE | Gr ROW Gr, Gb ROW Gb | THE IMAGE QUALITY OF 2D IMAGE CAN BE MAINTAINED TO SOME EXTENT, WHILE OBTAINING A 3D IMAGE |
| | A-2 | | | | | Gr COLUMN Gr, Gb COLUMN Gb | |
| CLASSIFICATION B | B-1 | EXIST (NOT EXIST) | NOT EXIST (EXIST) | NOT EXIST | ONLY ONE PIXEL OF Gr (OR Gb) | Gr ROW Gr | HIGH RESOLUTION IS MAINTAINED IN 2D IMAGE, WHILE OBTAINING 3D INFORMATION |
| | B-2 | | | | | Gb COLUMN Gb (OR Gr COLUMN Gr) | |
| CLASSIFICATION C | C-1 | EXIST | EXIST | NOT EXIST | EACH TWO PIXELS OF Gr, Gb | Gr ROW Gr, Gb ROW Gb | OBTAINING 3D COLOR IMAGE HAVING FAIRLY HIGH RESOLUTION AND 2D IMAGE WITH SOMEWHAT LOW RESOLUTION |
| | C-2 | | | | | Gr COLUMN Gr, Gb COLUMN Gb | |
| CLASSIFICATION D | D-1 | EXIST | NOT EXIST | EXIST | EACH THREE PIXELS OF Gr, R, B | Gr ROW Gr, R, Gb ROW B | OBTAINING 3D COLOR IMAGE WITH SUFFICIENT IMAGE QUALITY WHILE ALSO OBTAINING INFORMATION ON 2D IMAGE |
| | D-2 | | | | | Gr COLUMN Rr, Gb COLUMN Gb, B | |
| CLASSIFICATION E | E-1 | EXIST | EXIST | EXIST | EACH FOUR PIXELS OF Gr, Gb, R, B | Gr ROW Gr, R, Gb ROW B, Gb | OBTAINING 3D COLOR IMAGE HAVING THE HIGHEST QUALITY WITH REDUCED RESOLUTION |
| | E-2 | | | | | Gr COLUMN R, Gr Gb COLUMN Gb, B | |

FIG. 10

|  | NON-PARALLAX PIXEL |
| :---: | :--- |
| ▮ | PARALLAX L PIXEL |
| ▮ | PARALLAX R PIXEL |

| | LEFT PARALLAX IMAGE | 2D IMAGE | RIGHT PARALLAX IMAGE | DISPARITY PIXEL AMOUNT |
|---|---|---|---|---|
| Out Focus | 3 | 2 | 1 | 1 |
| Focus | 2 | 2 | 2 | 0 |
| In Focus | 1 | 2 | 3 | -1 |

IMAGE PROCESSING APPARATUS AND IMAGE PROCESSING PROGRAM

TECHNICAL FIELD

The contents of the following Japanese and International patent applications are incorporated herein by reference:
  No. 2011-090141 filed in JP on Apr. 14, 2011, and
  No. PCT/JP2012/002600 on Apr. 13, 2012.
The present invention relates to an image processing apparatus and an image processing program.

RELATED ART

A stereo image capturing apparatus capturing a stereo image made of a right-eye image and a left-eye image using two image-capturing optical systems has been known. Such a stereo image capturing apparatus generates parallax between two images by capturing images of the same subject using two image-capturing optical systems arranged with a certain interval therebetweeen.
Patent Document No. 1: Japanese Patent Application Publication No. H8-47001

SUMMARY

So as to obtain color parallax images, it has been necessary to prepare an image capturing optical system and an image capturing element that are complex, to capture the parallax images.

According to a first aspect of the innovations herein, provided is an image processing apparatus including: an image obtaining section that obtains an image data group including reference image data and parallax image data by image-capturing the same scene, the parallax image data having parallax with respect to a subject image of the reference image data, and at least one of the reference image data and the parallax image data being non-color image data lacking at least a part of primary color information for generating a color image; a disparity amount operation section that calculates an amount of disparity that corresponds to parallax between the same subject images respectively of the reference image data and the parallax image data; and an image converting section that converts the non-color image data to color image data, by implanting at least a part of the primary color information of one of the reference image data and the parallax image data to the other of the reference image data and the parallax image data based on the amount of disparity.

According to a second aspect of the innovations herein, provided is an image processing program that makes a computer implement a procedure including: obtaining an image data group including reference image data and parallax image data by image-capturing the same scene, the parallax image data having parallax with respect to a subject image of the reference image data, and at least one of the reference image data and the parallax image data being non-color image data lacking at least a part of primary color information for generating a color image; calculating an amount of disparity that corresponds to parallax between the same subject images respectively of the reference image data and the parallax image data; and converting the non-color image data to color image data, by implanting at least a part of the primary color information of one of the reference image data and the parallax image data to the other of the reference image data and the parallax image data based on the amount of disparity.

The summary clause does not necessarily describe all necessary features of the embodiments of the present invention. The present invention may also be a sub-combination of the features described above.

BRIEF DESCRIPTION OF THE DRAWINGS

FIG. 10 explains various examples in which parallax pixels are allocated to a Bayer array when there are two kinds of parallax pixels.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the present invention.

A digital camera according to the present embodiment, which is one embodiment of an image capturing apparatus, is configured to generate images corresponding to a plurality of view points for one scene. Images taken from different view points are referred to as "parallax image."

Figure 1:
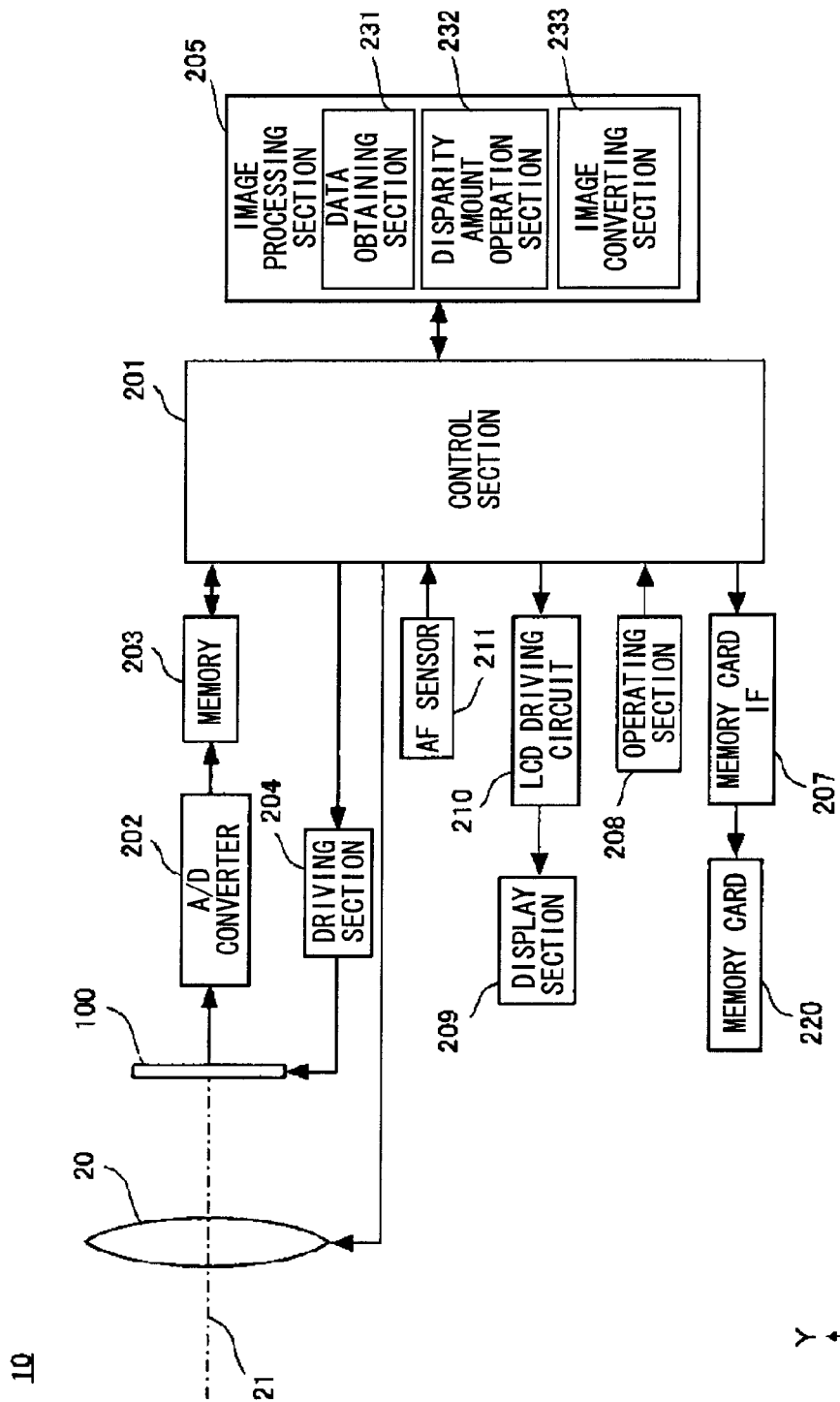
FIG. 1 is a diagram showing the configuration of a digital camera according to an embodiment of the present invention.

FIG. 1 is a diagram showing the configuration of a digital camera 10 according to an embodiment of the present invention. The digital camera 10 includes an image capturing lens 20 which is an image capturing optical system, and guides a subject light flux incident along the optical axis 21 towards the image-capturing element 100. The image capturing glens 20 may alternatively a lens unit detachable with respect to the digital camera 10. The digital camera 10 includes an image-capturing element 100, a control section 201, an A/D converter 202 a memory 203, a driving section 204, an image processing section 205, a memory card IF 207, an operating section 208, a display section 209, an LCD driving circuit 210, and an AF sensor 211.

Note that as shown in this drawing, the direction parallel to the optical axis 21 towards the image-capturing element 100 is determined as z-axis plus direction, and the direction towards the front side of the paper in which the drawing is drawn on the plane orthogonal to the z-axis is defined as the x-axis plus direction, and the upper direction of the paper is determined as the y-axis plus direction. In some of the drawings that follow, the coordinates axes are shown to clarify the orientations of the drawings with reference to the coordinates axis of FIG. 1.

The image-capturing lens 20 is made up of a plurality of optical lens groups, and forms an image of the subject light flux from a scene, in the vicinity of the focus plane. Note that the image-capturing lens 20 in FIG. 1 is represented by a virtual single lens provided in the vicinity of the pupil. The image-capturing element 100 is provided in the vicinity of the focus plane of the image-capturing lens 20. The image-capturing element 100 is an image sensor (e.g., CCD, CMOS sensor) in which a plurality of photoelectric conversion elements are arranged two dimensionally. The driving section 204 controls the timing of the image capturing element 100 at which the image capturing element 100 converts a subject image formed on the light receiving plane and outputs it to the A/D converter 202.

The A/D converter 202 converts the image signal outputted from the image capturing element 100 into a digital image signal, and outputs it to a memory 203. The image processing section 205 performs various types of image processing using the memory 203 as a workspace, thereby generating image data. In particular, the image processing section 205 includes a data obtaining section 231 to obtain an image data group by generating such an image data group from the signal outputted from the image capturing element 100, a disparity amount operation section 232 for calculating the disparity amount using the pieces of parallax image data included in the obtained image data group, and an image converting section 233 for performing conversion of non-color image data to color image data. Each processing is detailed later.

The image processing section 205 also conducts general image processing functions such as adjusting the image data according to the selected image format. The generated image data can be converted to a display signal by the LCD driving circuit 210, and displayed to the display section 209. The generated image data can also be recorded in the memory card 220 mounted to the memory card IF 207.

The AF sensor 211 is a phase difference sensor that sets a plurality of ranging points for the subject space, and detects an amount of defocus of the subject image at each ranging point. A series of image capturing sequences starts by the operating section 208 receiving an operation from a user, and outputting an operating signal to the control section 201. Various operations such as AF and AE related to the image capturing sequences are executed under control of the control section 201. For example, the control section 201 analyzes a detection signal of the AF sensor 211 and performs focus control for moving the focus lens making up a part of the image capturing lens 20.

Figure 2A:
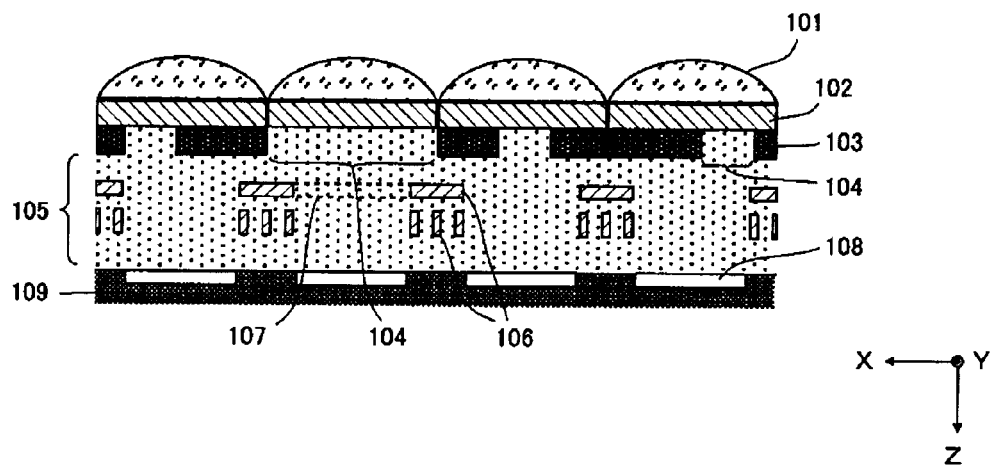
FIG. 2A is a schematic view of a cross section of an image capturing element according to an embodiment of the present invention.
Figure 2B:
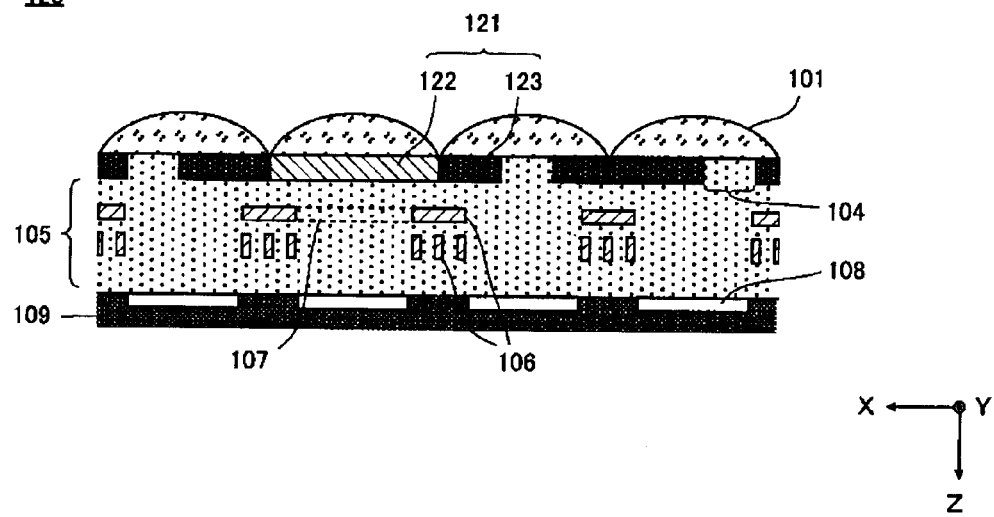
FIG. 2B is a schematic view of a cross section of an image capturing element according to an embodiment of the present invention.

Next, the configuration of the image capturing element 100 is detailed. FIG. 2A and FIG. 2B are a schematic view of a cross section of an image capturing element according to an embodiment of the present invention. FIG. 2A is a schematic view of a cross section of an image capturing element 100 in which the color filter 102 and the opening mask 103 are included as separate entities. On the other hand, FIG. 2B is a schematic view of a cross section of an image capturing element 120 having a screen filter 121 in which the color filter section 122 and the opening mask section 123 are integrally formed. The image capturing element 120 is a modification example of the image capturing element 100.

As shown in FIG. 2A, in the image capturing element 100, a micro lens 101, a color filter 102, an opening mask 103, a wiring layer 105, and a photoelectric conversion element 108 are arranged in this order from the side of the subject. The photoelectric conversion element 108 is made up of a photodiode that converts incident light into an electric signal. A plurality of photoelectric conversion elements 108 are arranged two dimensionally on the surface of the substrate 109.

The image signal resulting from conversion by the photoelectric conversion element 108, the control signal for controlling the photoelectric conversion element 108, or the like are transmitted and received via the wiring 106 provided for the wiring layer 105. In addition, the opening mask 103 having openings 104 provided in one-to-one relation to the photoelectric conversion elements 108 contact the wiring layer. As detailed later, the openings 104 are shifted for the corresponding photoelectric conversion elements 108, and their relative positions are strictly determined. The opening mask 103 including this opening 104 operates to generate the parallax to the subject light flux received by the photoelectric conversion element 108 as detailed later.

On the other hand, there is no opening mask 103 provided on the photoelectric conversion elements 108 not desired to generate any parallax. It can also be said that an opening mask 103 having an opening 104 which does not restrict incident subject light flux to the corresponding photoelectric conversion element 108, i.e., which transmits the entire effective light flux, is provided. Or, the wiring 106 can be interpreted as an opening mask that transmits the entire effective light flux that does not cause parallax, since it is practically the wiring 106 that defines the opening 107 through which the incident subject light flux is defined. The opening masks 103 may be arranged independently from each other to correspond to the respective photoelectric conversion elements 108, or alternatively may be formed collectively to the plurality of photoelectric conversion elements 108 just as done to produce the color filters 102.

The color filters 102 are provided on the opening masks 103. The color filters 102 are filters provided in one-to-one relation to the photoelectric conversion elements 108 and are each colored to transmit a specific wavelength region towards the corresponding photoelectric conversion element 108. For outputting a higher quality color image, it is preferable to arrange three or more types of color filters. These color filters can be interpreted as the primary color filters for generating a color image. An exemplary combination of the primary color filters may consist of a red filter transmitting a red wavelength region, a green filter transmitting a green wavelength region, and a blue filter transmitting a blue wavelength region. The color filters are arranged in a grid formation to correspond to the photoelectric conversion elements 108 as detailed later.

The micro lenses 101 are provided on the color filters 102. The micro lenses 101 are light-collecting lenses for guiding incident subject light flux as much as possible onto the photoelectric conversion elements 108. The micro lenses 101 are provided in one-to-one relation to the photoelectric conversion lenses 108. It is preferable that the optical axes of the micro lenses 101 are shifted so that as much subject light flux as possible can be guided to the photoelectric conversion elements 108, taking into consideration the relative positional relation between the center of the pupil of the image capturing lens 20 and the photoelectric conversion element 108. Moreover, the position of the micro lenses 101 may be adjusted together with the position of the openings 104 of the opening masks 103, so that the specific subject light flux explained later can be received as much as possible.

A unit made of a single opening mask 103, a single color filter 102, and a single micro lens 101 provided in one-to-one relation to a photoelectric conversion element 108 are referred to as "pixel." In particular, a pixel provided with an opening mask 103 causing parallax is referred to as "parallax pixel," and a pixel not provided with any opening mask 103 is referred to as "non-parallax pixel." For example, when an image capturing element 100 has an approximately 24 mm×16 mm effective pixel region, the number of pixels will be about 12 million.

Note that no micro lens 101 would be necessary for an image sensor having favorable light collecting efficiency and photoelectric conversion efficiency. The back side illumination image sensor is provided with the wiring layer 105 at the side opposite to the side at which the photoelectric conversion elements 108 are provided.

There may be various modification examples to the combination of the color filter 102 and the opening mask 103. For example, by adding a color component to the opening section 104 of the opening mask 103 in the example of FIG. 2A, the color filter 102 and the opening mask 103 can be integrally formed. In another example in which a specific pixel is used to obtain brightness information of a subject, the pixel needs not be provided with any color filter 102. Alternatively, it is also possible to provide an uncolored transparent filter so as to transmit almost all the wavelength regions of the visible light.

When the pixel used to obtain brightness information is made as a parallax pixel (i.e., when a parallax image is at least temporarily outputted as a monochroic image), the image capturing element 120 of the configuration shown as FIG. 2B can be adopted. To be more specific, the screen filter 121, in which the color filter section 122 functioning as a color filter and the opening mask section 123 including the opening section 104 are integrally formed, may be provided between the micro lens 101 and the wiring layer 105.

In the color filter section 122, the screen filter 121 is colored in blue, green, and red, and the masking portions in the opening mask section 123 excluding the opening section 104 are colored in block, for example. The image capturing element 120 that adopts the screen filter 121 has higher light collecting efficiency than the image capturing element 100 because of shorter distance from the micro lens 101 to the photoelectric conversion element 108.

Figure 3:
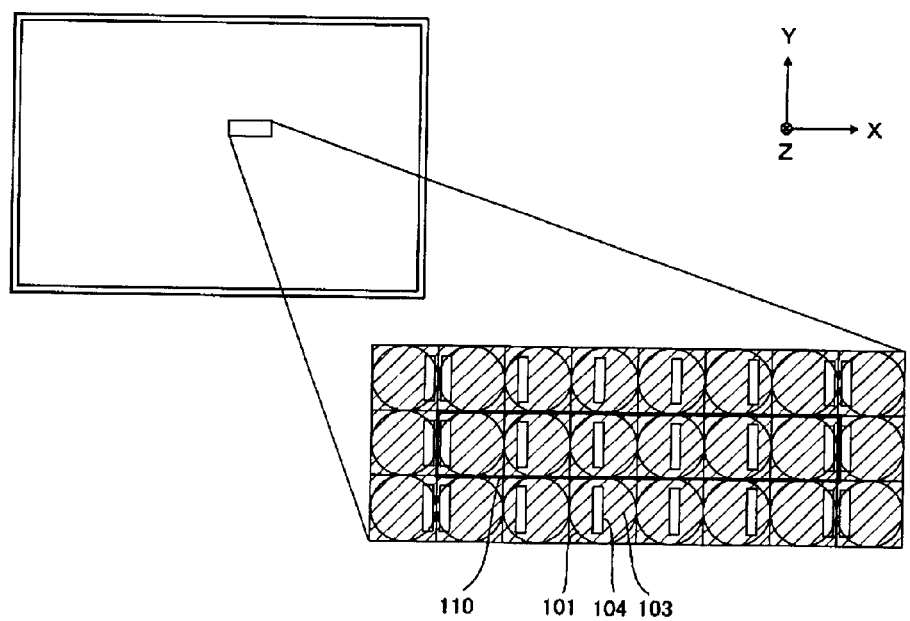
FIG. 3 is a schematic enlarged view of a part of an image capturing element.

The following explains the openings 104 of the opening mask 103 and their relation with the caused parallax. FIG. 3 is a schematic enlarged view of a part of an image capturing element. So as to simplify the explanation for the moment, the colors of the color filters 102 are not considered until later. In the following explanation before the colors of the color filters 102 are taken into consideration, the image sensor can be considered as a collection of parallax pixels all of which have a color filter 102 of the same color (including a transparent color filter). Therefore, the repetitive pattern explained below can be considered as pixels adjacent to each other in the color filter 102 of the same color.

As shown in FIG. 3, the openings 104 of the opening mask 103 are provided to be shifted relative to the corresponding pixels. Moreover, openings 104 respectively of adjacent pixels have been displaced to each other.

In the example shown in this drawing, there are six types of opening masks 103 provided whose openings 104 corresponding to the pixels are shifted from each other in the right and left direction. From the perspective of the entire image capturing element 100, groups of photoelectric conversion elements are arranged two dimensionally as well as periodically, each group of photoelectric conversion element being made up of a set of six parallax pixels within which the opening masks 103 gradually shift from the left to the right in the paper in which the drawing is drawn. The image capturing element 100 can also be expressed such that the repetitive patterns 110 each including a set of photoelectric conversion elements are periodically arranged.

Figure 4:
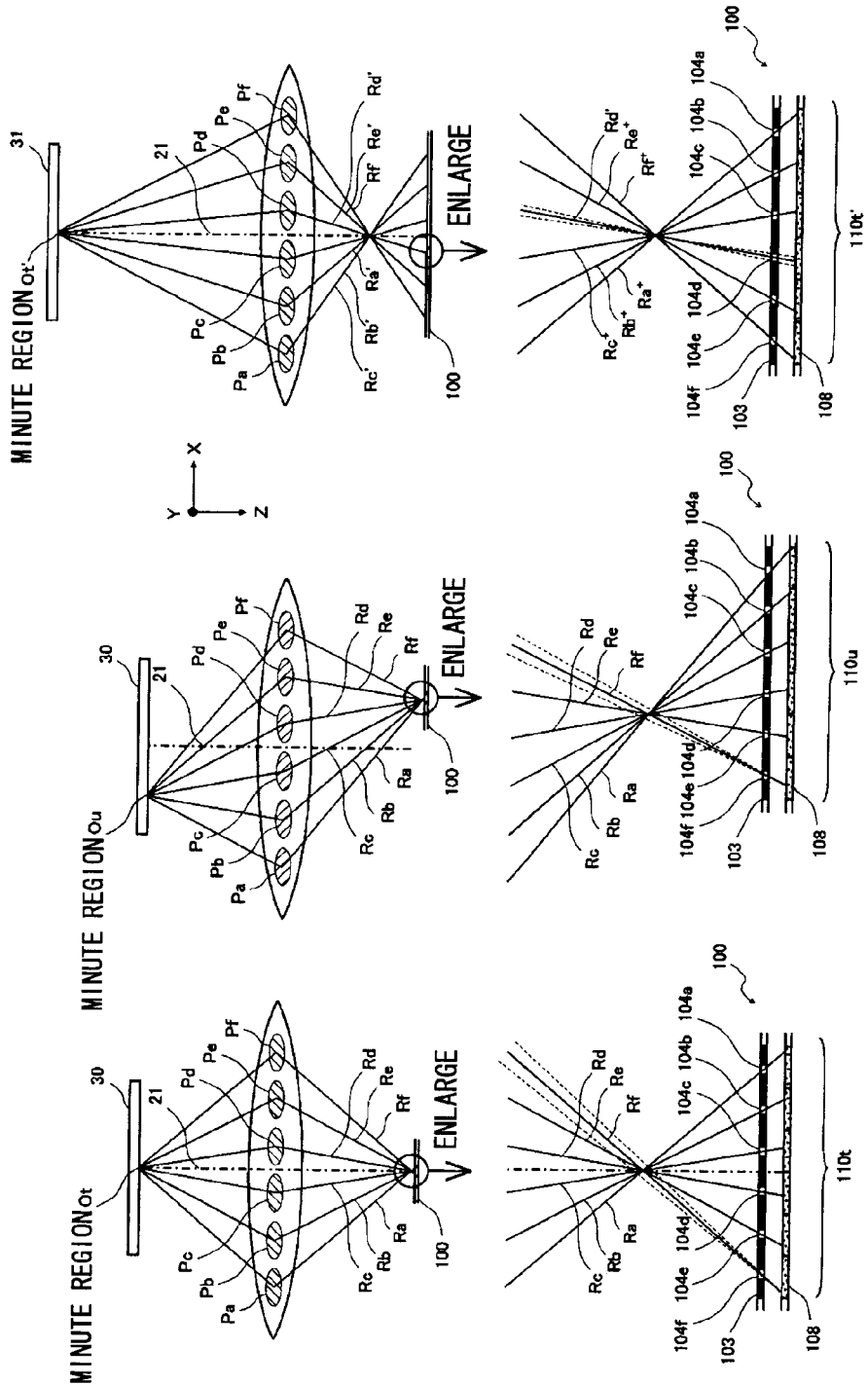
FIG. 4A is a conceptual diagram for explaining the relation between a parallax pixel and a subject.
FIG. 4B is a conceptual diagram for explaining the relation between a parallax pixel and a subject.
FIG. 4C is a conceptual diagram for explaining the relation between a parallax pixel and a subject.

FIG. 4A, FIG. 4B, and FIG. 4C are a conceptual diagram for explaining the relation between a parallax pixel and a subject. FIG. 4A especially represents a group of photoelectric conversion elements of the repetitive pattern 110$t$ arranged at the center orthogonal to the image capturing optical axis 21, in the image capturing element 100, and FIG. 4B schematically shows a group of photoelectric conversion elements of a repetitive pattern 110$u$ arranged at the peripherals. The subject 30 in FIG. 4A and FIG. 4B exists at the focus position of the image capturing lens 20. FIG. 4C schematically shows the relation in a case in which the subject 31 existing on the non-focus position for the image capturing lens 20 is captured, in contrast to FIG. 4A.

First, the relation between a parallax pixel and a subject when the image capturing lens 20 has captured the subject 30 at the focus state is explained. The subject light flux passes through the pupil of the image capturing lens 20 to be guided towards the image capturing element 100. There are six partial regions Pa-Pf defined for the entire cross section through which the subject light flux passes. As is clear from the enlarged view, the pixels of the group of photoelectric conversion elements constituting the repetitive patterns 110$t$ and 110$u$ at the leftmost side of the paper are arranged to define the position of the opening 104$f$ of the opening mask 103 so that only the subject light flux emitted from the partial region Pf can reach the photoelectric conversion element 108. Likewise, with respect to the rightmost pixels, the position of the opening 104$e$ is defined to correspond to the partial region Pe, the position of the opening 104$d$ is defined to correspond to the partial region Pd, the position of the opening 104$c$ is defined to correspond to the partial region Pc, the position of the opening 104$b$ is defined to correspond to the partial region Pb, and the position of the opening 104a is defined to correspond to the partial region Pa.

It can also be said that the position of the opening 104f is defined by the gradient of the principle light ray Rf emitted from the partial region Pf that is defined by the relative positional relation between the partial region Pf and the leftmost pixel. When the photoelectric conversion element 108 receives the subject light flux from the subject 30 existing on the focused position via the opening 104f, the subject light flux forms an image on the photoelectric conversion element 108 as shown by the dotted lines. Likewise, it can be expressed such that with respect to the rightmost pixel, the position of the opening 104e is determined by the gradient of the principle light ray Re, the position of the opening 104d is determined by the gradient of the principle light ray Rd, the position of the opening 104c is determined by the gradient of the principle light ray Rc, the position of the opening 104b is determined by the gradient of the principle light ray Rb, and the position of the opening 104a is determined by the gradient of the principle light ray Ra.

As shown in FIG. 4A, the light flux of the subject 30 existing on the focused position emitted from the minute region Ot on the subject 30 crossing the optical axis 21 passes the pupil of the image capturing lens 20 to reach each pixel of the group of photoelectric conversion elements constituting the repetitive pattern 110t. In other words, each pixel in the group of photoelectric conversion elements constituting the repetitive pattern 110t receive the light flux emitted from a single minute region Ot via six partial regions Pa-Pf respectively. The minute region Ot has a spread that can accommodate the positional displacement of each pixel of the group of photoelectric conversion elements constituting the repetitive pattern 110t, however can be approximated to substantially one object point. Likewise as shown in FIG. 4B, the light flux of the subject 30 existing on the focused position emitted from the minute region Ou on the subject 30 distanced from the optical axis 21 passes the pupil of the image capturing lens 20 to reach each pixel of the group of photoelectric conversion elements constituting the repetitive pattern 110u. In other words, each pixel in the group of photoelectric conversion elements constituting the repetitive pattern 110u receives the light flux emitted from a single minute region Ou via six partial regions Pa-Pf respectively. Just as the minute pattern Ot, the minute region Ou has a spread that can accommodate the positional displacement of each pixel of the group of photoelectric conversion elements constituting the repetitive pattern 110u, however can be approximated to substantially one object point.

Therefore, as long as the subject 30 exists on the focused position, there are different minute regions caught by the group of photoelectric conversion elements depending on the position of the repetitive pattern 110 on the image capturing element 100, and that each pixel constituting the group of photoelectric conversion elements catches the same minute region via partial regions different from one another. Across the repetitive patterns 110, the pixels corresponding to each other receive the subject light flux from the same partial region. In the example of the drawings, the leftmost pixels of the repetitive pattern 110t and 110u receive the subject light flux from the same partial region Pf.

Note that the position of the opening 104f through which the leftmost pixel receives the subject light flux from the partial region Pf in the repetitive pattern 110t arranged at the center orthogonal to the image capturing optical axis 21 is different, in a strict sense, from the position of the opening 104f through which the leftmost pixel receives the subject light flux from the partial region Pf in the repetitive pattern 110u arranged at the peripherals. However, from the functional point of view, they can be treated as the same type of opening mask in the sense that they both are an opening mask for receiving the subject light flux from the partial region Pf. Therefore, each of the parallax pixels arranged on the image capturing element 100 in the example of FIG. 4A, FIG. 4B, and FIG. 4C can be said to include one of the six types of opening masks.

Next, the relation between the parallax pixel and a subject when the image capturing lens 20 has captured the subject 30 at a non-focus state is explained. In this case too, the subject light flux from the subject 31 existing on the non-focus position pass the six partial regions Pa-Pf of the pupil of the image capturing lens 20, to reach the image capturing element 100. Note that the subject light flux from the subject 31 existing on the non-focused position forms an image at a position different than on the photoelectric conversion element 108. For example as shown in FIG. 4C, when the subject 31 exists farther from the image capturing element 100 than the subject 30, the subject light flux forms an image nearer the subject 31 than the photoelectric conversion element 108. Conversely, when the subject 31 is closer to the image capturing element 100 than the subject 30, the subject light flux forms an image at an opposite side of the photoelectric conversion element 108 with respect to the subject 31.

Therefore, the subject light flux of the subject 31 existing on the non-focus position emitted from the minute region Ot' reaches the corresponding pixel in different sets of repetitive patterns 110 depending on which of the six partial regions Pa-Pf the subject light flux passes. For example, the subject light flux passed through the partial region Pd is incident to the photoelectric conversion element 108 having the opening 104d included in the repetitive pattern 110e as the principle light ray Rd', as shown in the enlarged view of FIG. 4C. Even among the subject light flux emitted from the minute region Ot', the subject light flux passed the other partial region will not incident on the photoelectric conversion element 108 included in the repetitive pattern 110t', but will be incident to the photoelectric conversion element 108 including the corresponding opening in the other repetitive pattern. In other words, the subject light fluxes reaching respective photoelectric conversion elements 108 constituting the repetitive pattern 110t' are subject light fluxes emitted from different minute regions from each other of the subject 31. In other words, the subject light flux having Rd' as the principle light ray is incident on the 108 corresponding to the opening 104d, whereas to the photoelectric conversion elements 108 corresponding to the other openings, the subject light fluxes having Ra+, Rb+, Rc+, Re+, and Rf+ as the principle light ray are incident. These subject light fluxes are respectively emitted from different minute regions of the subject 31. This relation holds true for the repetitive pattern 110u arranged in the peripheral portion in FIG. 4B.

From the point of view of the entire image capturing element 100, the subject image A caught by the photoelectric conversion element 108 corresponding to the opening 104a does not displace from the subject image D caught by the photoelectric conversion element 108 corresponding to the opening 104d when these subject images correspond to the subjects existing on the focused position, and if the subject images correspond to the subjects existing on the non-focused position, the subject images are displaced with each other. The direction and the amount of the displacement are determined by such factors as how much the subject existing on the non-focused position is displaced in which direction and in what amount from the focused position, and the distance between the partial region Pa and the partial region Pd. In other words, the subject image A and the subject image D are parallax images with respect to each other. This relation holds true for the other openings, and so six parallax images corresponding to the openings 104a-104f are generated.

Therefore, a parallax image is obtained by collecting the output of the pixels corresponding to each other from each repetitive pattern 110 configured in this way. That is, the output of the pixels received the subject light fluxes emitted from each specific partial region from the six partial regions Pa-Pf forms a parallax image.

Figure 5:
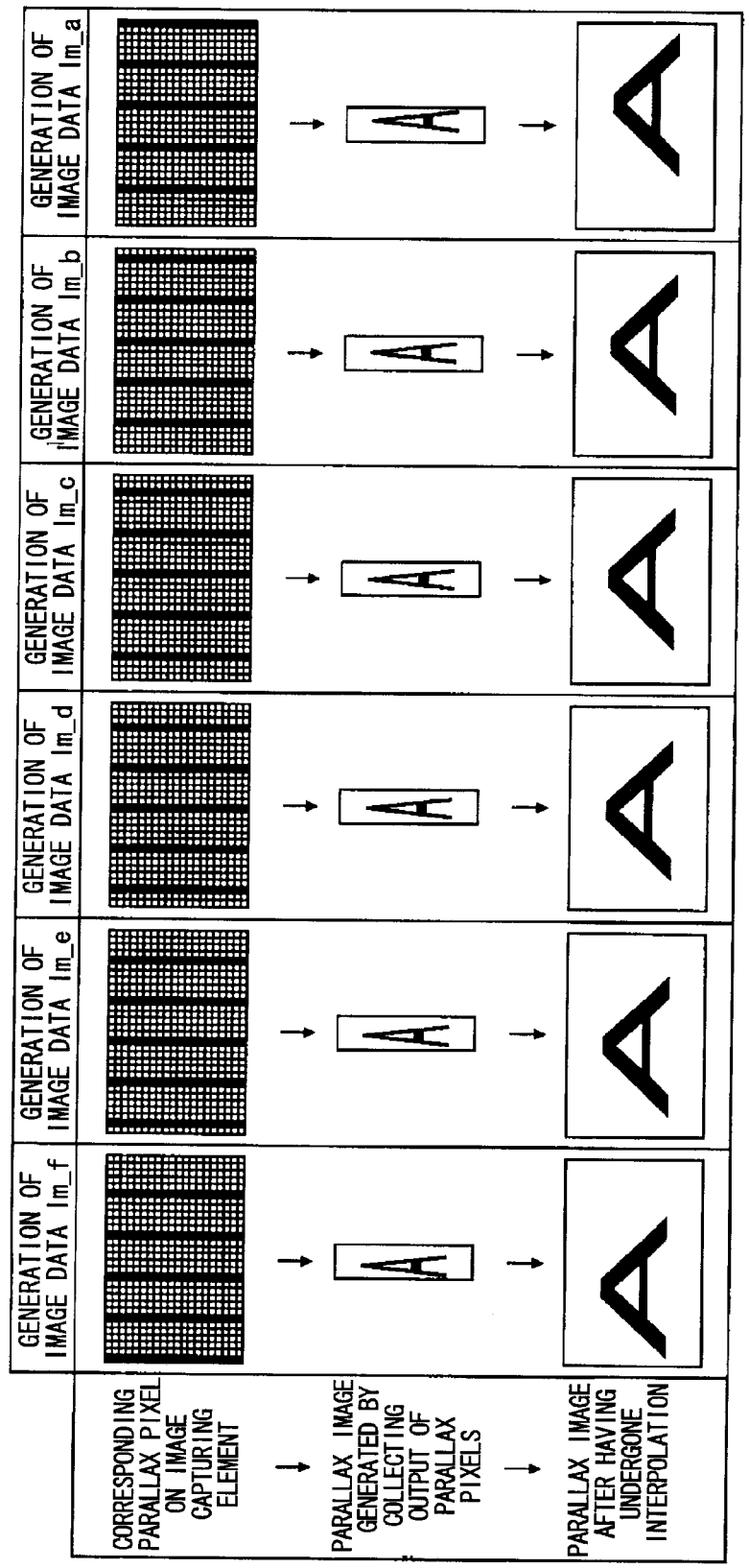
FIG. 5 is a conceptual diagram for explaining a process to generate a parallax image.

FIG. 5 is a conceptual diagram for explaining a process to generate a parallax image. The drawing shows, from the left, generation of the parallax image data Im_f generated by collecting the output of the parallax pixels corresponding to the opening 104f, generation of the parallax image data Im_e generated by collecting the output of the parallax pixels corresponding to the opening 104e, generation of the parallax image data Im_d generated by collecting the output of the parallax pixels corresponding to the opening 104d, generation of the parallax image data Im_c generated by collecting the output of the parallax pixels corresponding to the opening 104c, generation of the parallax image data Im_b generated by collecting the output of the parallax pixels corresponding to the opening 104b, and generation of the parallax image data Im_a generated by collecting the output of the parallax pixels corresponding to the opening 104a. First, the generation of the parallax image data Im_f generated by the output from the opening 104f is explained.

The repetitive patterns 110 each made up of a photoelectric conversion element group made of a set of six parallax pixels are arranged as an array in the lateral direction. The parallax pixels having the opening 104f are positioned on the image capturing element 100 in every six pixels in the lateral direction and to be consecutive in the longitudinal direction. These pixels receive the subject light flux from minute regions different from each other as stated above. A parallax image can be obtained by arranging the collection of the output of these parallax pixels.

However, each pixel of the image capturing element 100 according to the present embodiment is a square pixel. Therefore, by simply collecting them, the number of pixels in the lateral direction will be thinned out to ⅙, resulting in image data that is long in the longitudinal direction. By applying interpolation processing to generate six times the number of pixels in the lateral direction, the parallax image data Im_f is generated as an image having the original aspect ratio. However, since the parallax image data before subjected to interpolation is the image thinned out to ⅙ in the lateral direction, the resolution of the resulting image in the lateral direction is lower than the resolution in the longitudinal direction. This suggests the incompatibility between the number of parallax image data generated and the improvement of resolution.

As a result of similar processing, the parallax image data Im_e—the parallax image data Im_a are obtained. That is, the digital camera 10 can generate six parallax images from six different view points having parallaxes in the lateral direction.

Figure 6A:
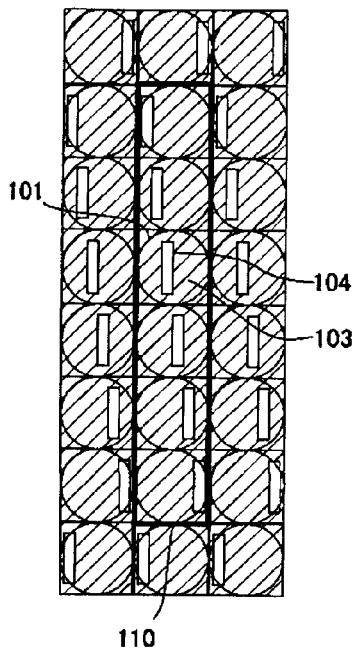
FIG. 6A shows another example of a repetitive pattern.
Figure 6B:
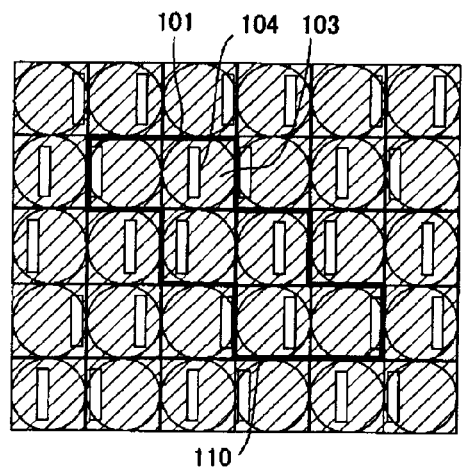
FIG. 6B shows another example of a repetitive pattern.

In the above example, the repetitive pattern 110 was explained as an array in the lateral direction. However, the repetitive pattern 110 is not limited to this example. FIGS. 6A and 6B show different examples of the repetitive pattern 110.

FIG. 6A is an example in which six pixels arranged in the longitudinal direction are selected as a repetitive pattern 110. It may be noticed that the openings 104 of the parallax pixels gradually shift from the left to the right of the paper in which the drawing is drawn starting from the parallax pixel on top of the paper. The repetitive pattern 110 in such an arrangement can also be used to generate parallax images having six view points giving parallax in the lateral direction. Compared to the repetitive pattern 110 of FIG. 3, this repetitive pattern can be said as a repetitive pattern that can maintain the resolution in the lateral direction at the cost of resolution in the longitudinal direction.

FIG. 6B is an example in which six pixels adjacent in an oblique direction are used as a repetitive pattern 110. It may be noticed that the openings 104 of the parallax pixels gradually shift from the left to the right of the paper in which the drawing is drawn starting from the leftmost top parallax pixel in the paper in which the drawing is drawn towards the lower right direction. The repetitive pattern 110 in such an arrangement can also be used to generate parallax images having six view points giving parallax in the lateral direction. Comparing with the repetitive pattern 110 of FIG. 3, this repetitive pattern can be said as a repetitive pattern that can maintain the resolutions in both the lateral and longitudinal directions to some extent while increasing the number of parallax images.

Comparing the repetitive pattern 110 of FIG. 3 with the repetitive patterns 110 respectively of FIG. 6A and FIG. 6B, their difference boils down to whether they sacrifice the resolution in the longitudinal direction or the lateral direction compared to the resolution of a single image made from the entire image when attempting to generate parallax images from six view points. The repetitive pattern 110 of FIG. 3 makes the resolution in the lateral direction to ⅙. The repetitive pattern 110 of FIG. 6A makes the resolution in the longitudinal direction to ⅙. The repetitive pattern 110 of FIG. 6b cuts the resolution to ⅓ in the longitudinal direction and to ½ in the lateral direction. In either case, one pattern includes openings 104a-104f that each are corresponded with a pixel. Each of the openings 104a-104f is to receive the subject light flux from the corresponding one of the partial regions Pa-Pf. Therefore, each repetitive pattern 110 has the same amount of disparity.

Figure 7:
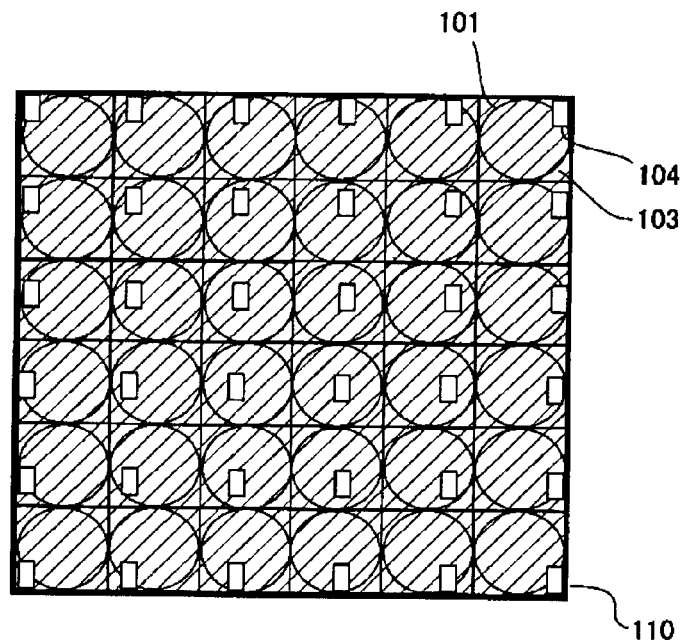
FIG. 7 shows an example of a two-dimensional repetitive pattern.

The above examples are directed to generation of a parallax image for giving parallax in the lateral direction. However, it is possible to generate a parallax image for giving parallax in the longitudinal direction and two dimensionally in both of the longitudinal and lateral directions. FIG. 7 shows an example of a two-dimensional repetitive pattern 110.

The example of FIG. 7 shows a repetitive pattern 110 that has 36 pixels (six pixels in the lateral direction and six pixels in the longitudinal direction) as a set of photoelectric conversion elements. In addition, 36 types of opening masks 103 are prepared to shift the openings 104 for the pixels in both the vertical and horizontal directions. Specifically, the openings 104 are arranged so that they gradually shift from top to down from the uppermost pixel to the lowermost pixel of the repetitive pattern 110, as well as gradually shifting from the left to the right from the leftmost pixel to the rightmost pixel.

The image capturing element 100 having this repetitive pattern 110 can output parallax images of 36 view points that can give parallax in both of the longitudinal direction and the lateral direction. It is needless to say that the repetitive pattern 110 is not limited to the example shown in FIG. 7, and can be determined arbitrarily so as to output parallax images of a different number of view points.

The example stated above adopts rectangular openings 104. In the arrangement that gives parallax in the lateral direction in particular, the amount of light can be secured for the photoelectric conversion element 108 by making the width in the longitudinal direction not shifted to be wider than the width in the lateral direction to be shifted. However, the shape of the openings 104 is not limited to rectangular.

Figure 8:
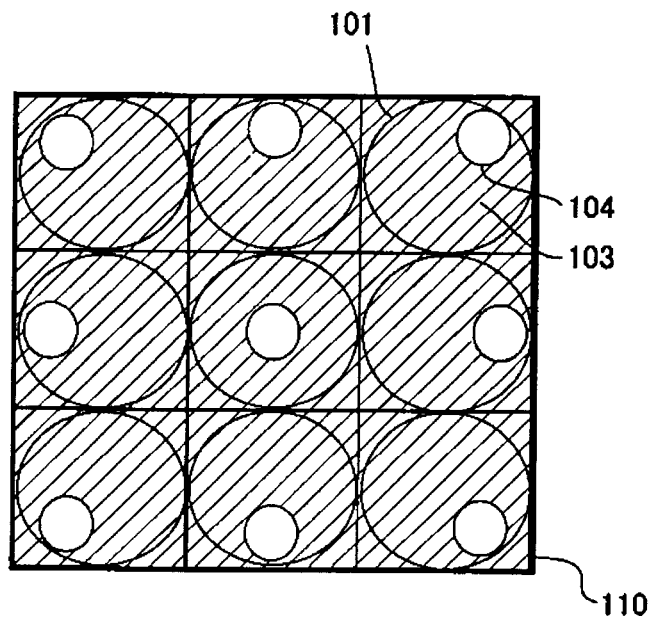
FIG. 8 explains another shape of an opening.

FIG. 8 explains another shape of an opening 104. In this drawing, the shape of the opening 104 is defined as round. A round opening 104 can prevent unintended subject light flux from being incident on the photoelectric conversion element 108 as stray light, thanks to the similarity to the hemispherical shape of the micro lens 101.

Figure 9:
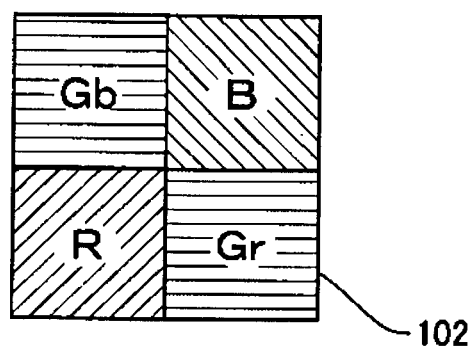
FIG. 9 explains a Bayer array.

The following is an explanation on the color filter 102 and the parallax image. FIG. 9 explains a Bayer array. As shown in this drawing, in the Bayer array, the upper left pixel and the lower right pixel are green filters, the lower left pixel is a red filter, and the upper right pixel is a blue filter. In this specification, the upper left pixel assigned a green filter is referred to as a Gb filter, and the lower right pixel assigned another green filter is referred to as a Gr pixel. In addition, the pixel assigned a red filter is referred to as a R pixel, and the pixel assigned a blue filter is referred to as a B pixel. The lateral direction along which the Gb pixel and the B pixel are aligned is referred to as a Gb row, and the lateral direction along which the R pixel and the Gr pixel are aligned is referred to as a Gr row. The longitudinal direction along which the Gb pixel and the R pixel are aligned is referred to as a Gb column, and the longitudinal direction along with the B pixel and the Gr pixel are aligned is referred to as a Gr column.

An enormous number of repetitive patterns 110 can be configured for a particular array of color filters 102 by determining which parallax pixel and non-parallax pixel are to be assigned and in which periodicity and for which colored pixel. By collecting the output of the non-parallax pixels, the captured image data can be without parallax just as a normal captured image. By increasing the ratio of the non-parallax images, a 2D image having a high resolution can be outputted. However, this repetitive pattern may not be suited for a 3D image composed of a plurality of parallax images because it is expected that the image quality will degrade because of a relatively small ratio of parallax pixels. Conversely, by increasing the ratio of parallax pixels, a 3D image will have increased image quality, while in the case of a 2D image, the resolution thereof will be low.

In the trade-off relation stated above, various repetitive patterns 110 having various features can be set by determining the positioning of the parallax pixels and the non-parallax pixels. FIG. 10 explains various examples in which parallax pixels are allocated to a Bayer array when there are two kinds of parallax pixels. The examples assume the parallax L pixel whose opening 104 is decentered towards left from the center, and the parallax R pixel whose opening 104 is decentered towards right from the center. That is, the two view point parallax images outputted from the parallax images realize a so-called stereoscopic vision.

Please refer to the drawing for the explanation of the features of the repetitive patterns. For example, if many non-parallax pixels are assigned, it will make 2D image data of a high resolution. If non-parallax pixels are assigned uniformly across the RGB pixels, it will make 2D image data having a high image quality without less color shift.

On the other hand, when many parallax pixels are assigned, it will make 3D image data of a high resolution. If parallax pixels are assigned uniformly across the RGB pixels, the 3D image will have favorable color reproduction and high quality for a 3D image.

Figure 11:
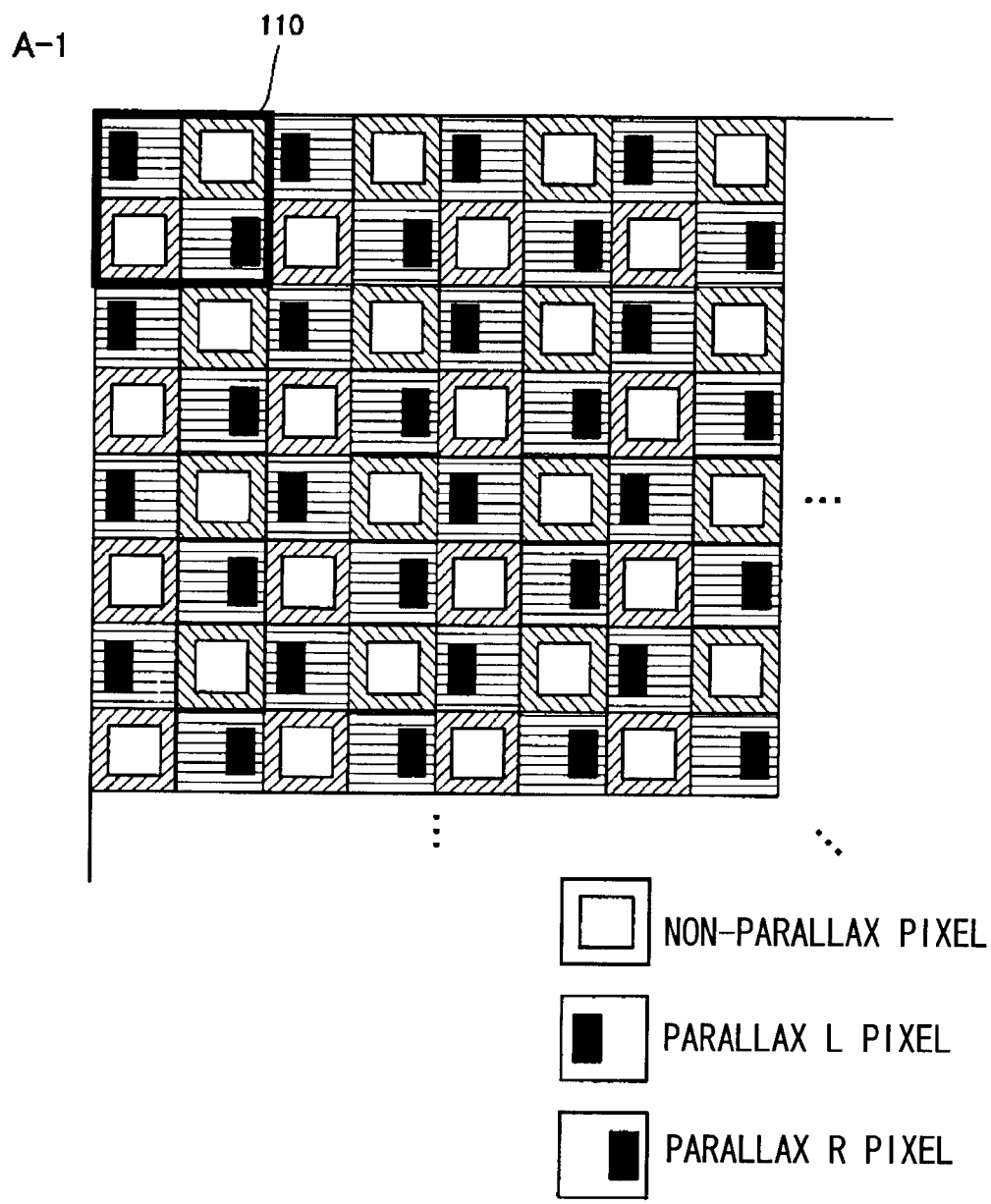
FIG. 11 shows an example of a different variation.

The following explains some variations. FIG. 11 shows an example of a different variation. The variation shown in FIG. 11 corresponds the classification A-1 of the repetitive patterns of FIG. 10.

In the example of the drawing, the same four pixels used in the Bayer array are used as the repetitive pattern 110. The R pixel and the 13 pixel are non-parallax pixels, and the Gb pixel is assigned to the parallax L pixel and the Gr pixel to the parallax R pixel. In this case, the openings 104 are determined so that the parallax L pixel and the parallax R pixel contained in the same repetitive pattern 110 can receive the subject light flux emitted from the same minute region, when the subject exists on the focused position.

In the example of the drawing, the Gb pixel and the Gr pixel are both green pixels having high luminosity, and so a parallax image having high contrast is expected to be obtained. In addition, both of the Gb pixel and the Gr pixel used are green pixels, and so the two outputs can be easily converted to an output without parallax. Therefore, 2D image data having high image quality can be generated together with the output of the R pixel and the B pixel that are non-parallax pixels.

Figure 12:
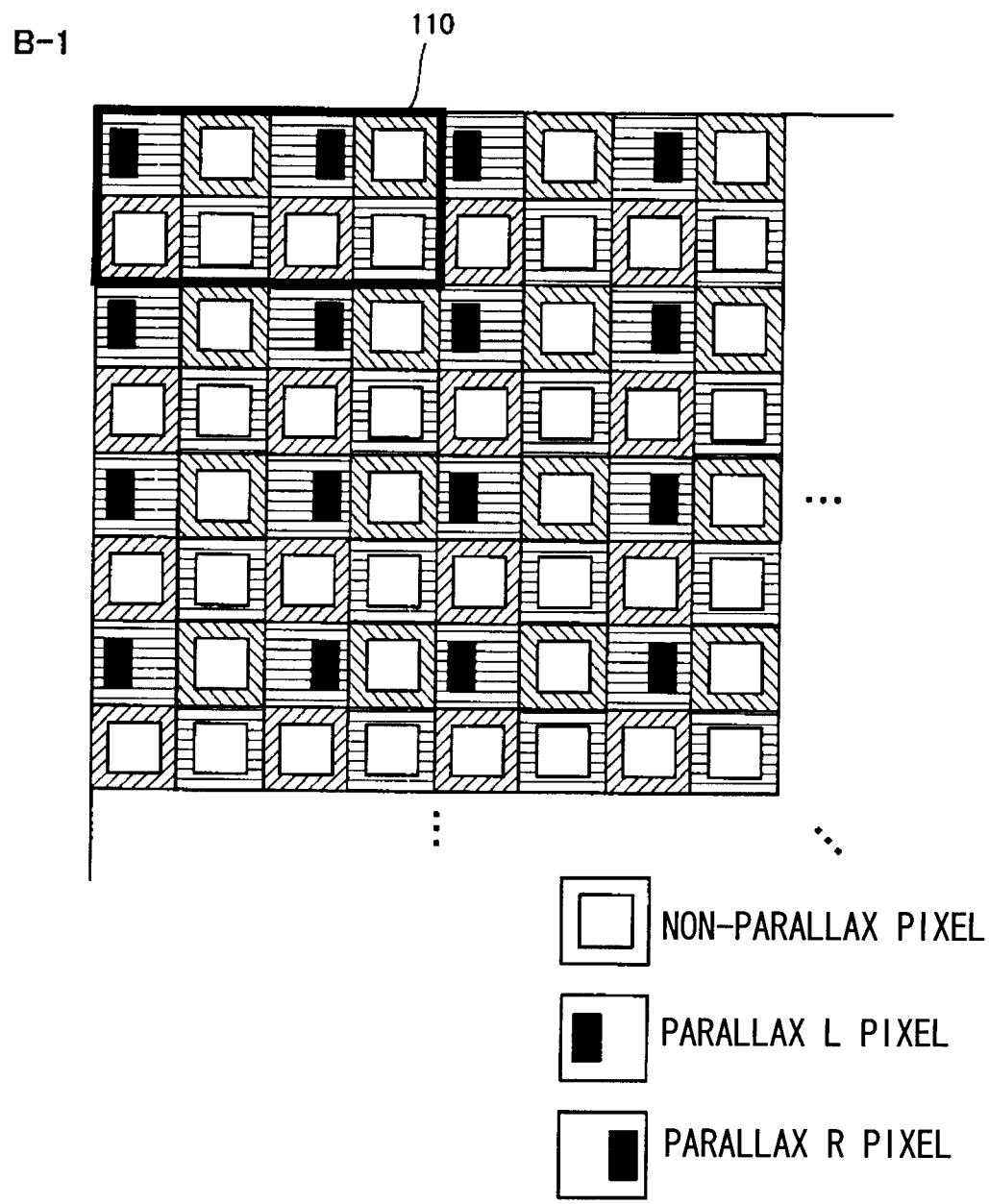
FIG. 12 shows an example of a different variation.

FIG. 12 shows an example of a different variation. The variation shown in FIG. 12 corresponds the classification B-1 of the repetitive patterns of FIG. 10.

In the example of the drawing, eight pixels having two sets of four pixels of the Bayer array arranged in the lateral direction are used as the repetitive pattern 110. Out of these eight pixels, the left Gb pixel is assigned the parallax L pixel, and the right Gb pixel is assigned the parallax R pixel. In this arrangement, the Gr pixel is set to be the non-parallax pixel, and so further enhanced image quality can be expected from the 2D image compared to the example of FIG. 10.

Figure 13:
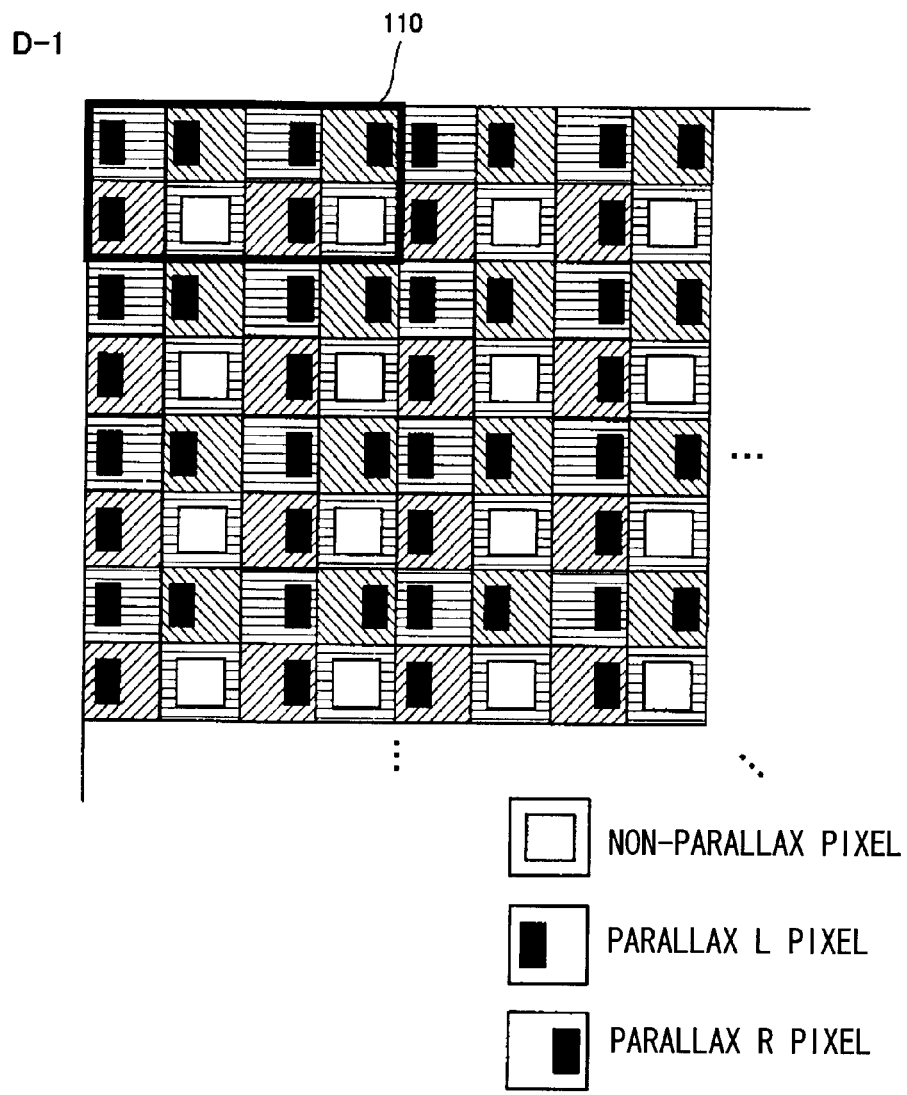
FIG. 13 shows an example of a different variation.

FIG. 13 shows an example of a different variation. The variation shown in FIG. 13 corresponds to the classification D-1 of the repetitive patterns of FIG. 10.

In the example of the drawing, eight pixels having two sets of four pixels of the Bayer array arranged in the lateral direction are used as the repetitive pattern 110. Out of these eight pixels, the left Gb pixel is assigned the parallax L pixel, and the right Gb pixel is assigned the parallax R pixel. Further, the left R pixel is assigned the parallax L pixel, and the right R pixel is assigned the parallax R pixel. Further, the left B pixel is assigned the parallax L pixel, and the right B pixel is assigned the parallax R pixel. The two Gr pixels are assigned non-parallax pixels.

The parallax L pixel and the parallax R pixel assigned to the two Gb pixels receive the light flux emitted from a single minute region, when capturing a subject existing on the focused position. Both of the parallax L pixel and the parallax R pixel assigned to the two R pixels receive the light flux emitted from a single minute region different from that of the Gb pixel, and both of the parallax L pixel and the parallax R pixel assigned to the two B pixels receive the light flux emitted from a single minute region different from those of the Gb pixel and the R pixel. This helps increase the resolution of a 3D image three hold in the longitudinal direction compared to FIG. 12. Besides, three color output corresponding to RGB can be obtained, which realizes high quality 3D color image.

Note that when two kinds of parallax pixels are provided as explained above, it will produce parallax images of two view points. However, various numbers of types of parallax pixels can be adopted as explained with reference to FIG. 3, FIG. 7, and FIG. 8, or the like, according to the number of parallax images desired to be outputted. Various repetitive patterns 110 can be formed even when the number of view points is increased. Thus, the repetitive pattern 110 that suites to the particular specification, purpose, or the like can be selected.

The above-stated example adopts the Bayer array as a color filter array. However, other color filter arrangement can also be adopted. If such a color filter arrangement is adopted, each of the parallax pixels constituting a set of photoelectric conversion elements may preferably include an opening mask 103 having openings 104 facing different partial regions from each other.

Therefore, the image capturing element 100 may include photoelectric conversion elements 108 arranged two dimensionally and photoelectric converting incident light into an electric signal, opening masks 103 provided in a one-to-one relation with at least a part of the photoelectric conversion elements 108, and color filters 102 provided in a one-to-one relation with at least a part of the photoelectric conversion elements 108, where the openings 104 of the opening masks 103 provided to correspond to at least two (may be three or more) out of the n photoelectric conversion elements 108 adjacent to each other (n being an integer equal to or larger than 3) are included in a single pattern of the color filter patterns made of at least three types of color filters 102 transmitting respectively different wavelength regions, and transmit the light flux from partial regions different from each other in the sectional region of the incident light, and groups of photoelectric conversion elements each made of a set of n photoelectric conversion elements 108 may be periodically arranged.

Figure 14:
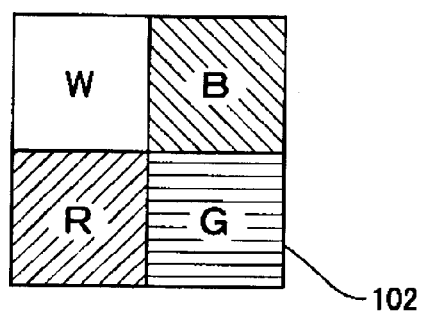
FIG. 14 shows another color filter array.

FIG. 14 explains another color filter array. As shown in the drawing, this color filter array is different from the Bayer array of FIG. 9 in that it has a W pixel to which no color filter is assigned instead of a Gb pixel, while keeping the Gr pixel of the Bayer array shown in FIG. 9 as a G pixel to which a color filter is assigned. Note that the W pixel may be assigned an uncolored transparent filter so as to transmit substantially all the wavelength region of the visible light as stated above.

The color filter array including the stated W pixel can obtain highly accurate brightness information because the amount of light received by the W pixel improves compared to a case in which the color filter is provided instead, although the color information outputted by the image capturing element is slightly degraded. It is even possible to form a monochroic image by collecting the output of W pixels.

In the color filter arrangement including a W pixel, there are various modification examples of the repetitive pattern 110 of parallax pixels and non-parallax pixels. For example, the contrast of a subject image is higher in the image outputted through the W pixel than the image outputted through the colored pixel, even though the images have both been captured under a relatively dark environment. Therefore, by assigning a parallax pixel to the W pixel, the operational result is expected to have high accuracy in the matching processing performed among a plurality of parallax images. As explained later, the matching processing is performed as a part of the processing to obtain the amount of disparity pixels. The repetitive pattern 110 of parallax pixels and non-parallax pixels is set taking into consideration not only the effect to the resolution of 2D images and the effect to the image quality of parallax images but also the tradeoff between merits and demerits to the other information to be extracted.

Figure 15:
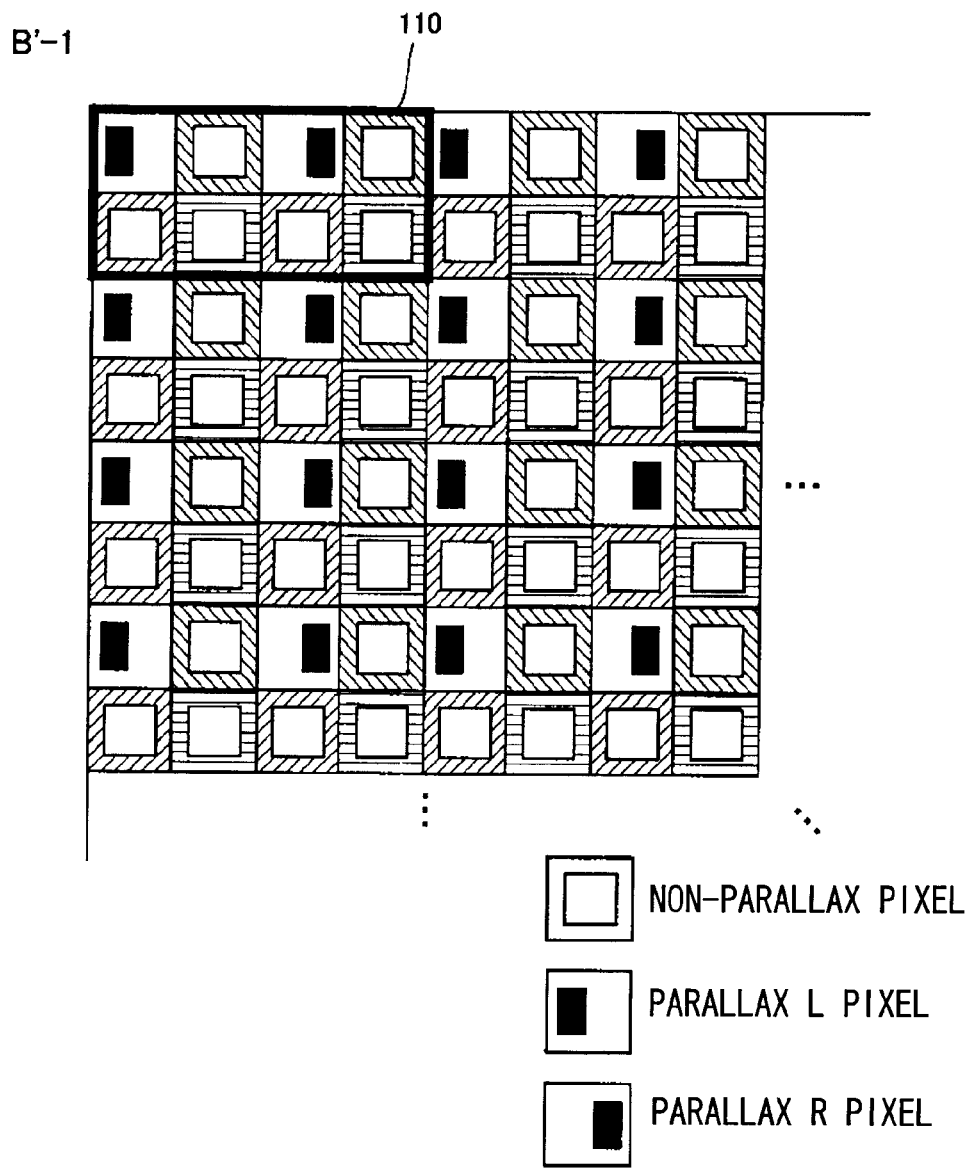
FIG. 15 shows an example of an array of W pixels and parallax pixels.

FIG. 15 shows an example of an array of W pixels and parallax pixels when another color filter array different from FIG. 14 is adopted. The variation shown in FIG. 15 is denoted as B'-1 because it is similar to the repetitive pattern classification B-1 of FIG. 12 which is one of the Bayer array. In the explanation of this drawing, the repetitive pattern 110 includes 8 pixels made of two sets of four pixels in another color filter arrangement oriented laterally. Among the eight pixels, the left W pixel is assigned a parallax L pixel, and the right W pixel is assigned a parallax R pixel. The image capturing element 100 having such an arrangement outputs a parallax image as a monochroic image and a 2D image as a colored image.

In this example, the image capturing element 100 includes photoelectric conversion elements 108 provided two dimensionally and photoelectric-converting incident light to an electric signal, opening masks 103 provided in a one-to-one relation to at least a part of the photoelectric conversion elements 108, and color filters 102 provided in a one-to-one relation to at least a part of the photoelectric conversion elements 108. Openings 104 of opening masks 103 provided to correspond to at least two of n (n being an integer equal to or greater than 4) photoelectric conversion elements 108 adjacent to each other may not be included in one of the color filter patterns constituted by at least three types of color filters 102 transmitting respectively different wavelength regions, and may be positioned to respectively transmit light fluxes from partial regions mutually different within the sectional region of the incident light, and that the groups of photoelectric conversion elements, each made up of a set of n photoelectric conversion elements 108, may be periodically arranged.

By simply collecting the output values of pixels, it is impossible to obtain all the 2D image data as color image data and the parallax image data as color image data in the arrangement of any of the variations explained above. Here, "color image data" means image data that has all the primary color information for generating a color image without any omission, an example of which is image data having, as primary color information, all the pixel values respectively corresponding to the RGB filters which are an example of a combination of primary color filters. Conversely, "non-color image data" represents image data that lacks at least a part of the primary color information necessary for generating a color image. For example, when only a G pixel is assigned a parallax L pixel, when only a G pixel is assigned a parallax L pixel, the left parallax image data generated by collecting the output of the parallax L pixels, though having pixel values corresponding to G filters as primary color information, lacks pixel values corresponding to R filters and B filters that are necessary for generating a color image. Therefore, the following explains each characteristic of the generated image data group by taking examples of some of the arrangement of the above-mentioned variation. Please note that it is the data obtaining section 231 that receives a signal outputted from the image capturing element 100 and generates each piece of image data of an image data group explained as follows.

Figure 16:
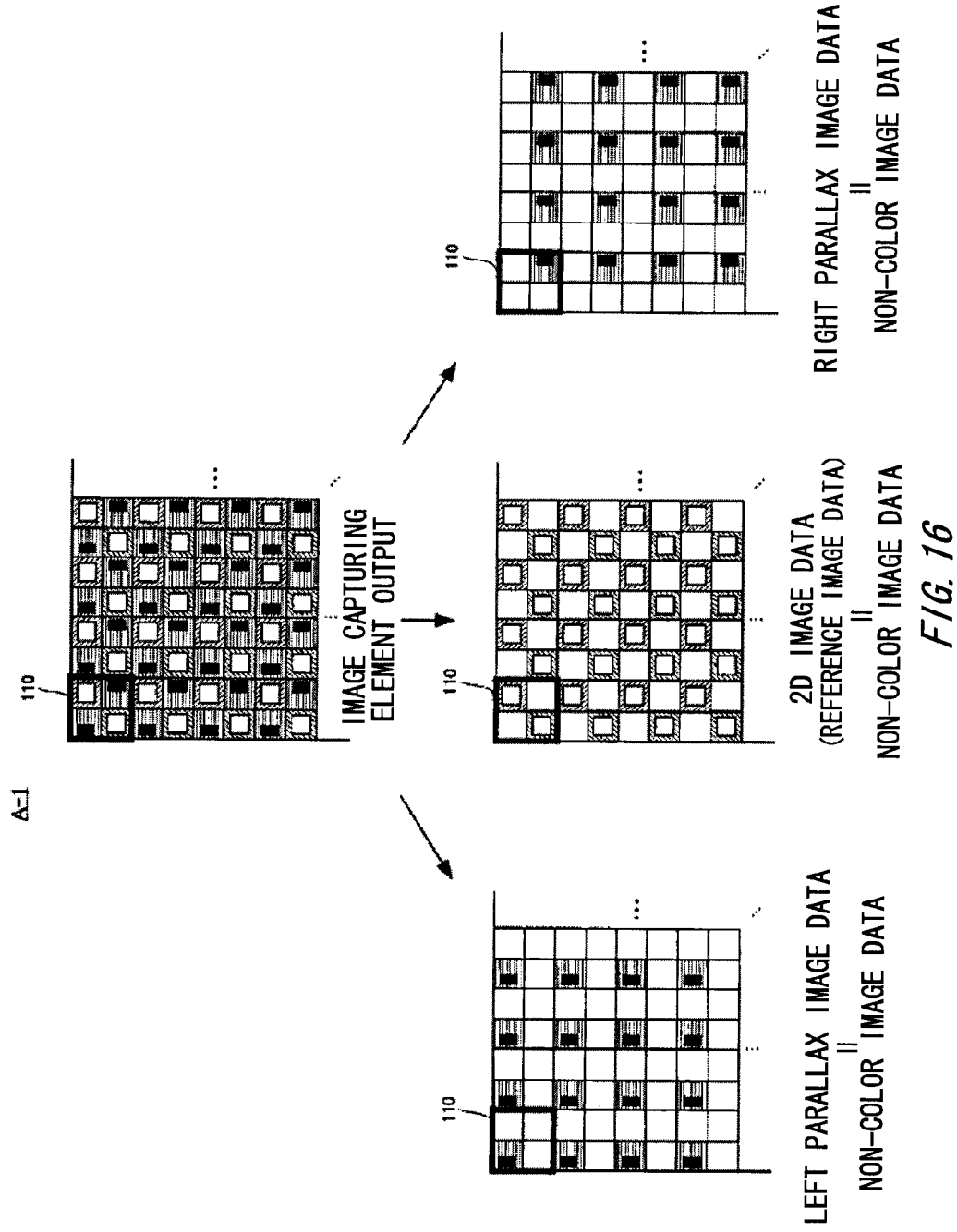
FIG. 16 explains an image data group generated from the output of the image capturing element according to the A-1 array.

FIG. 16 explains an image data group generated from the output of the image capturing element 100 according to the A-1 array explained above with reference to FIG. 11. As already explained above, the A-1 array is a repetitive pattern 110 made of four pixels just as the Bayer array. The R pixel and the B pixel are non-parallax pixels, and the Gb pixel is a parallax L pixel, and the Gr pixel is a parallax R pixel.

The left parallax image data shown in the drawing is generated by extracting only the output of the parallax L pixels from the pixel output of the image capturing element 100 by keeping the relative positional relation of the parallax L pixels. The left parallax image data maintains only the pixel value of the Gb pixel, but lacks the pixel values of R, Gr, and B pixels, which are represented in the drawing as empty grids. Therefore, this left parallax image data cannot generate a color image as a left parallax image by itself. In other words, the left parallax image data is generated as non-color image data.

Likewise, the right parallax image data shown in the drawing is generated by extracting only the output of the parallax R pixels from the pixel output of the image capturing element 100 by keeping the relative positional relation of the parallax R pixels. The right parallax image data maintains only the pixel value of the Gr pixel, but lacks the pixel values of R, Gb, and B pixels, which are represented in the drawing as empty grids. Therefore, this right parallax image data cannot generate a color image as a right parallax image by itself. In other words, the right parallax image data is generated as non-color image data.

The 2D image data shown in the drawing is generated by extracting only the output of the non-parallax pixels from the pixel output of the image capturing element 100 by keeping the relative positional relation of the non-parallax pixels. In the following explanation, 2D image data serves as reference image data. The 2D image data maintains only the pixel values of the R pixel and the B pixel, but lacks the pixel values of Gb, Gr pixels, which are represented in the drawing as empty grids. Therefore, this 2D image data cannot generate a color image as a 2D parallax image by itself. In other words, the 2D image data is generated as non-color image data.

As explained above, all of the 2D image data, the left parallax image data, and the right parallax image data, which are respectively an image data group generated by the output from the image capturing element 100 according to the A-1 array, are non-color image data. Therefore, none of them can generate a color image by itself.

Figure 17:
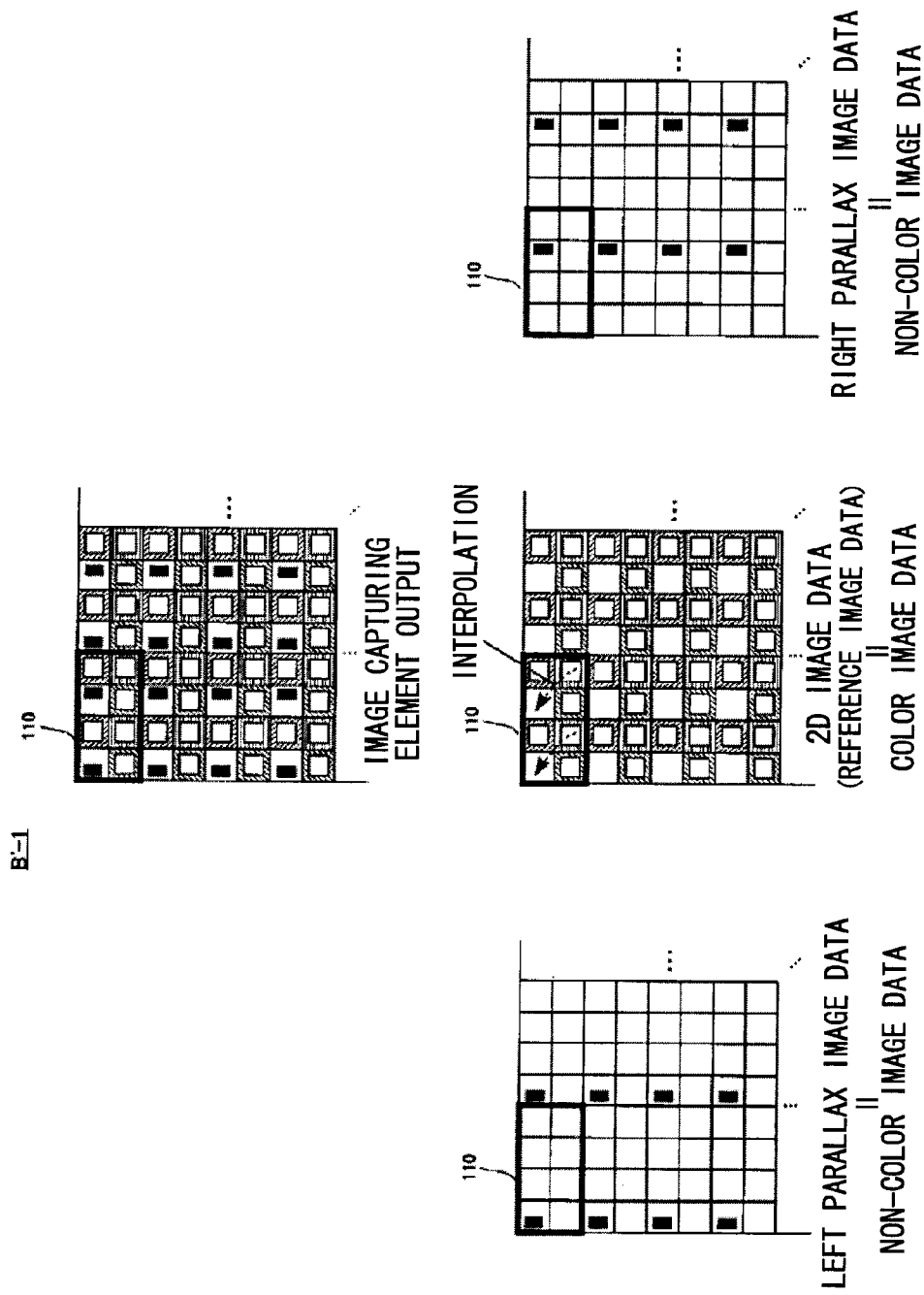
FIG. 17 explains an image data group generated from the output of the image capturing element according to the B'-1 array.

FIG. 17 explains an image data group generated from the output of the image capturing element 100 according to the B'-1 array explained above with reference to FIG. 15. As already explained above, the B'-1 array is a repetitive pattern 110 made of eight pixels which are two sets of four pixels in a color filter array shown in FIG. 14. Among the eight pixels, the left W pixel is a parallax L pixel, the right W pixel is a parallax R pixel, and the other R pixel, G pixel, and B pixel are no-parallax pixels.

The left parallax image data shown in the drawing is generated by extracting only the output of the parallax L pixels from the pixel output of the image capturing element 100 by keeping the relative positional relation of the parallax L pixels. The left parallax image data maintains only the pixel value of the left W pixel, but lacks the pixel values of R, G, and B pixels. Therefore, this left parallax image data cannot generate a color image as a left parallax image by itself. In other words, the left parallax image data is generated as non-color image data.

Likewise, the right parallax image data shown in the drawing is generated by extracting only the output of the parallax R pixels from the pixel output of the image capturing element 100 by keeping the relative positional relation of the parallax R pixels. The right parallax image data maintains only the pixel value of the right W pixel, but lacks the pixel values of R, G, and B pixels. Therefore, this right parallax image data cannot generate a color image as a right parallax image by itself. In other words, the right parallax image data is generated as non-color image data.

The 2D image data shown in the drawing is generated by extracting only the output of the non-parallax pixels from the pixel output of the image capturing element 100 by keeping the relative positional relation of the non-parallax pixels. The 2D image data maintains the pixel values of the R pixel, the G pixel, and the B pixel, and so can make color image data having the pixel values corresponding to the Bayer array if its pixel value of W pixel represented as an empty grid in the drawing is interpolated with the pixel value of the lower right G pixel. Therefore, using nothing but this 2D image data, a color image as a 2D image can be generated using a conventional image processing technology. Not limited to the pixel value of the lower right G pixel, the pixel value of the other G pixel can also be used in the interpolation.

As explained above, among the image data group generated by the output from the image capturing element 100 according to the B'-1 array, the 2D image data is color image data, and the left parallax image data and the right parallax image data are non-color image data.

Figure 18:
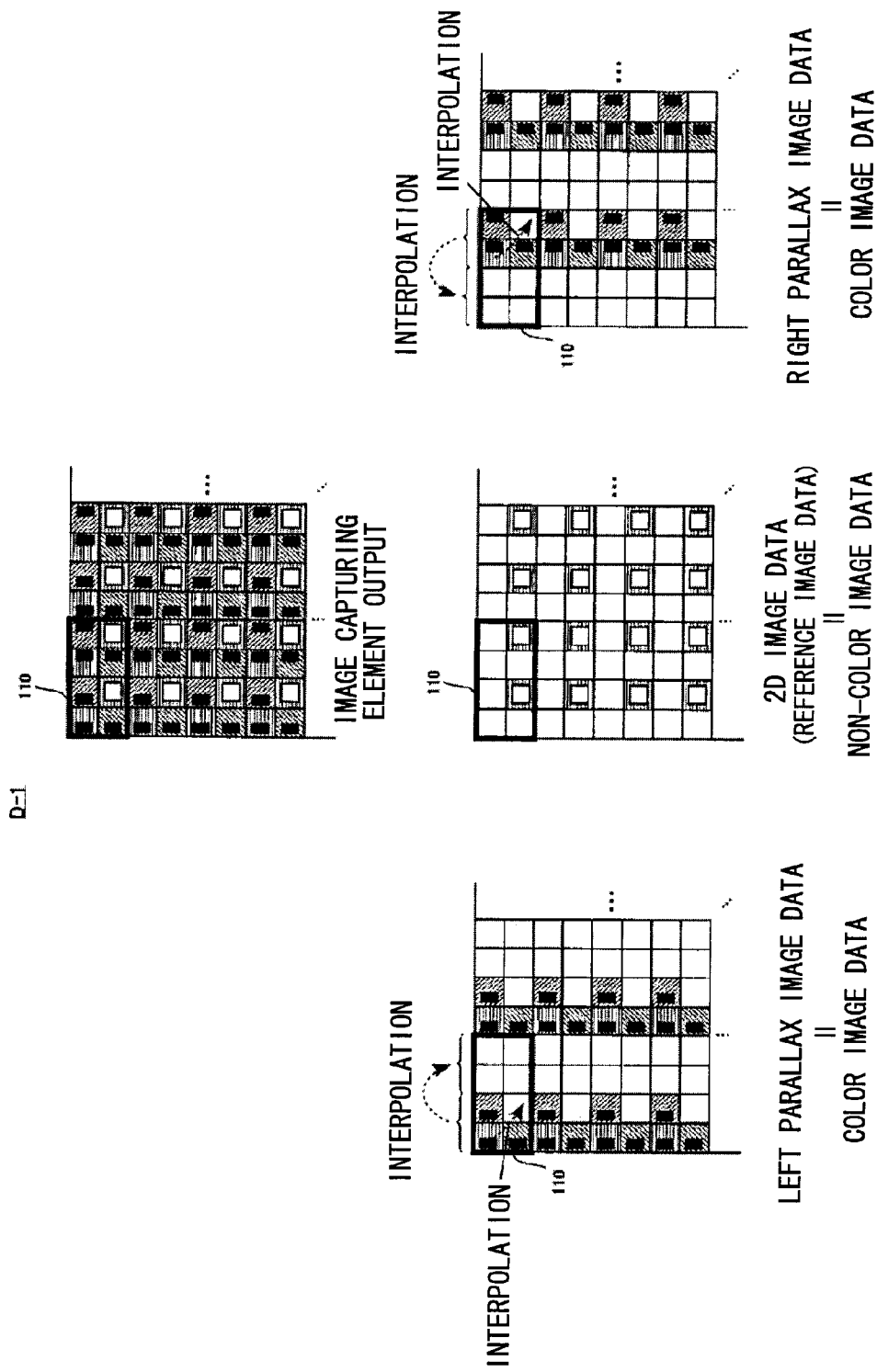
FIG. 18 explains an image data group generated from the output of the image capturing element according to the D-1 array.

FIG. 18 explains an image data group generated from the output of the image capturing element 100 according to the D-1 array explained above with reference to FIG. 13. As already explained above, the D-1 array is a repetitive pattern 110 made of eight pixels which are two sets of four pixels in the Bayer array. Among the eight pixels, the left R pixel, Gb pixel, and B pixel are parallax L pixels, the right R pixel, Gb pixel, and B pixel are parallax R pixels, and the two Gr pixels are no-parallax pixels.

The left parallax image data shown in the drawing is generated by extracting only the output of the parallax L pixels from the pixel output of the image capturing element 100 by keeping the relative positional relation of the parallax L pixels. In the left parallax image data, the left half side of the repetitive pattern 110 has the pixel values of the R pixel, the Gb pixel and the B pixel. The left parallax image data can make color image data having the pixel values corresponding to the Bayer array, by interpolating the pixel value of the Gr pixel with the pixel value of the Gb pixel and further applying the portion of the left half side of the repetitive pattern 110 having the full pixel values to the right half side as it is. This means that a color left parallax image can be generated solely from this left parallax image data.

Likewise, the right parallax image data shown in the drawing is generated by extracting only the output of the parallax R pixels from the pixel output of the image capturing element 100 by keeping the relative positional relation of the parallax R pixels. In the right parallax image data, the right half side of the repetitive pattern 110 has the pixel values of the R pixel, the Gb pixel and the B pixel. The right parallax image data can make color image data having the pixel values corresponding to the Bayer array, by interpolating the pixel value of the Gr pixel with the pixel value of the Gb pixel and further applying the portion of the right half side of the repetitive pattern 110 having the full pixel values to the left half side as it is. This means that a color right parallax image can be generated solely from this right parallax image data.

The 2D image data shown in the drawing is generated by extracting only the output of the non-parallax pixels from the pixel output of the image capturing element 100 by keeping the relative positional relation of the non-parallax pixels. The 2D image data maintains only the pixel value of the Gr pixel, but lacks the pixel values of R, Gb, and B pixels shown as empty grids in the drawing. Therefore, this 2D image data cannot generate a color image as a 2D image by itself. In other words, the 2D image data is generated as non-color image data.

As explained above, among the image data group generated by the output from the image capturing element 100 according to the D-1 array, the 2D image data is non-color image data, and the left parallax image data and the right parallax image data are color image data.

As explained above, among the image data group generated by the output of the image capturing element 100, at least one group is non-color image data. The following explains processing to convert thus generated non-color image data into color image data.

Figures 19A, 19B:
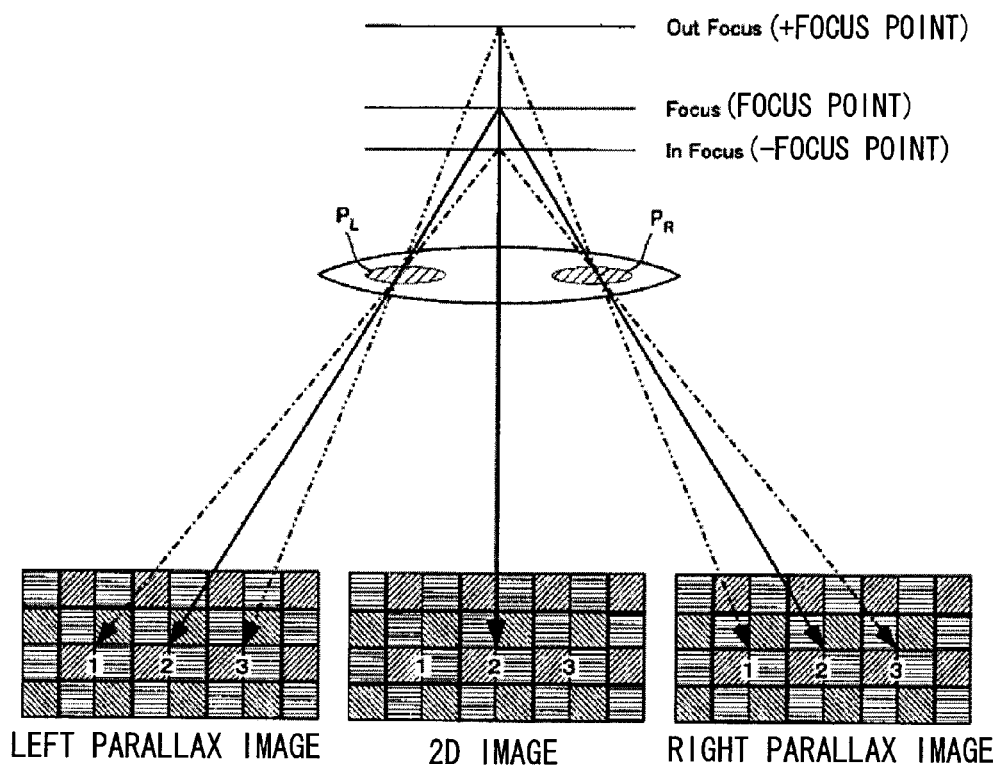
FIG. 19A explains the relation between the subject position and the disparity pixel amount.
FIG. 19B explains the relation between the subject position and the disparity pixel amount.

First, the amount of disparity pixels generated in the various types of image data when all of the 2D image data, the left parallax image data and the right parallax image data, each of which is a group of image data group generated by the output of the image capturing element 100, are assumed to be color image data. FIGS. 19A, 19B explain the relation between the subject position and the disparity pixel amount.

FIG. 19A is a conceptual diagram showing in which region of the 2D image, the left parallax image and the right parallax image, each of which corresponds to respective image data, the subject light flux emitted from the same minute region of the subject appears. Here, "subject position" represents the position of the subject in the depth direction which is along the z axis. This drawing shows cases in which the subject is in the focus position (Focus), the +focus position (Out Focus), and the −focus position (In Focus), with respect to the image capturing lens 20. The +focus position is father than the focus position, and the −focus position is nearer than the focus position. The following explanation adopts such a unit system that one pixel block is made up of four pixels composed of two longitudinal pixels and two lateral pixels, which is one pattern of the Bayer array.

In a 2D image, the subject light flux emitted from the same minute region appears in the same pixel block (block 2 in the drawing) regardless of whether the subject resides in the focus position, the +focus position, or the −focus position. In a left parallax image, the subject light flux emitted from the same minute region will appear in the block 2 just as the 2D image after the subject light flux has passed through the partial region $P_L$ of the pupil, if the subject resides in the focus position. If the subject resides in the −focus position, the left parallax image will have the subject light flux emitted from the same minute region in the block 1 after the subject light flux has passed through the partial region $P_L$ of the pupil, and if the subject resides in the +focus position, the left parallax image will have the subject light flux in the block 3. The right parallax image will have the subject light flux emitted from the same minute region in the block 2 just as the 2D image after the subject light flux has passed through the partial region $P_R$ of the pupil, if the subject resides in the focus position. If the subject resides in the −focus position, the right parallax image will have the subject light flux emitted from the same minute region in the block 3 after the subject light flux has passed through the partial region $P_R$ of the pupil, and if the subject resides in the +focus position, the left parallax image will receive the subject light flux in the block 1.

To summarize, if the subject resides in the focus position, the subject light flux emitted from the same minute region will appear in the same block among each image. On the other hand, if the subject resides in the non-focus position, the subject light flux appear in blocks mutually displaced among images, and that the direction of displacement reverses between the case in which the subject resides in the +focus position and the case in which the subject resides in the −focus position. Also as the relativity between the subject positions in the drawing shows, the amount of displacement increases as the non-focus position is distanced from the focus position by a greater degree.

FIG. 19B shows the relation between the disparity pixel amounts of the images shown in FIG. 19A. As already stated, when the subject is in a non-focus position, block numbers different from the block number 2 are assigned to the right parallax image and the left parallax image. The disparity pixel amount shown in the rightmost column of the drawing shows which by how many blocks the left parallax image is displaced from the 2D image which serves as a reference.

In the present embodiment, the partial regions $P_L$ and $P_R$ of the pupil are symmetrical to each other about the optical axis 21. Therefore, the disparity pixel amount of the right image with respect to the 2D image of the same subject will be the same in magnitude as and different in direction from the disparity pixel amount of the left image with respect to the 2D image. This means that a value obtained by reversing the sign of the disparity pixel amount shown in the rightmost column of the drawing can be used to indicate by how many blocks the right parallax image is displaced from the 2D reference image.

In the above discussion, such a reference unit of the disparity pixel amount was adopted that one pixel block is composed of a Bayer array pattern which is one exemplary pattern of a color filter. However, please note that the reference unit of the disparity pixel amount is not limited to this, and can also be one pixel, or a single repetitive pattern 110. In fact, the reference unit of the disparity pixel amount can be determined arbitrarily depending on various factors such as the resolution of each image data in the image data group, the required accuracy, and the entire operation load amount.

In the above discussion, in which pixel block the subject light flux emitted from the same minute region of the subject appears was explained. Conversely, if matching is performed between parallax images, the disparity pixel amount of each parallax block can be calculated. This enables to identify the correspondence between a pixel block of one parallax image to a pixel block of another parallax image. That is, the relative positional relation between pixel blocks in the parallax images which have captured the same minute region of a subject can be grasped. In addition, the disparity pixel amount with respect to the reference image is half the disparity pixel amount between parallax images. Therefore, how many blocks a left parallax image is displaced from the reference image can be calculated for all the blocks, and thus generated numerical sequence can form "disparity map."

Figure 20:
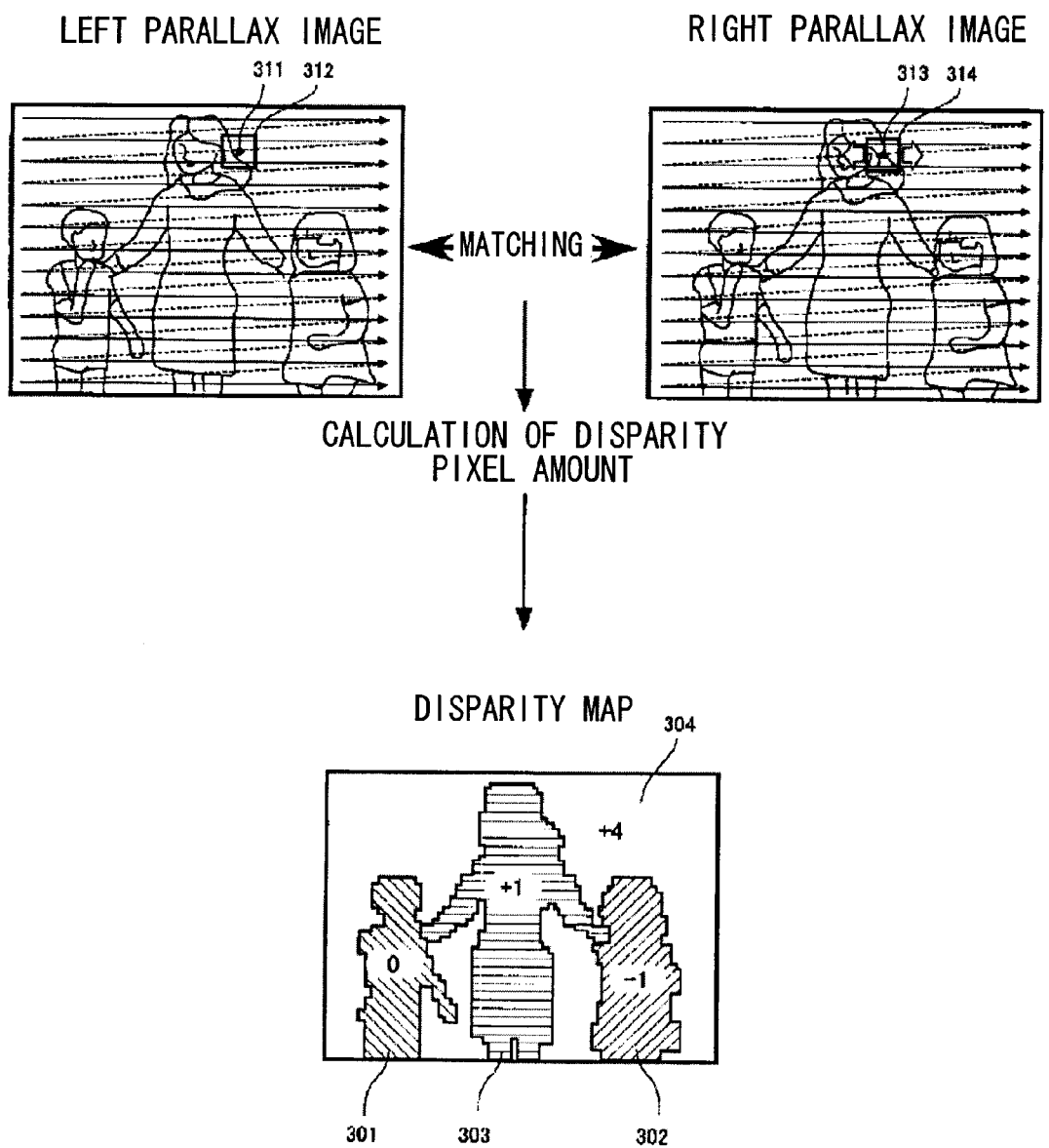
FIG. 20 is drawn for explaining a generating process of a disparity map.

FIG. 20 is drawn for explaining a generating process of a disparity map. The disparity amount operation section 232 receives left parallax image data and right parallax image data having been generated by the data obtaining section 231, and performs the following disparity map generating process.

The disparity amount operation section 232 decides a target pixel 311 having a pixel value, from among the pixels contained in a target block, and defines a local window 312 for this target pixel 311. Then, the disparity amount operation section 232 performs matching processing to the two images by referring to the local window 312, and determines the disparity pixel amount in the target block that contains the target pixel 311. More specifically, the disparity amount operation section 232 sets the position of the local window 314 on the right parallax image corresponding to the local window 312 on the left parallax image, and searches for an image region that realizes favorable match by moving the local window 314 relative to the local window 312. Then, the disparity amount operation section 232 determines the position of the local window 314 favorably matched, and calculates the coordinates value of the search pixel 313 being the central coordinates thereof. The disparity pixel amount is determined by converting the difference between the coordinates value of the target pixel 311 and the coordinates value of the search pixel 313 in the unit of a parallax block. Subsequently, the disparity amount operation section 232 performs the above-explained matching processing sequentially, by scanning the target pixel 311 sequentially from the upper left part to the lower right part of the left parallax image, thereby calculating out the disparity pixel amount of the left parallax image and the right parallax image.

Then, the calculated disparity pixel amounts are respectively halved to obtain a 2D image as a reference image, thereby completing the disparity map. The disparity map shows disparity pixel amounts as calculated above, which respectively correspond to the respective regions of subjects, which specifically are a boy 301, a girl 302, a lady 303, and a background 304 in the example of the drawing. In the example of the drawing, the boy 301 is focused, and so the disparity pixel amount is 0 in the region of the boy 301, −1 for the region of the girl 302 that is ahead of the boy 301, +1 for the region of the lady 303 that is behind the boy 301, and +4 for the background that is further back away.

Figure 21:
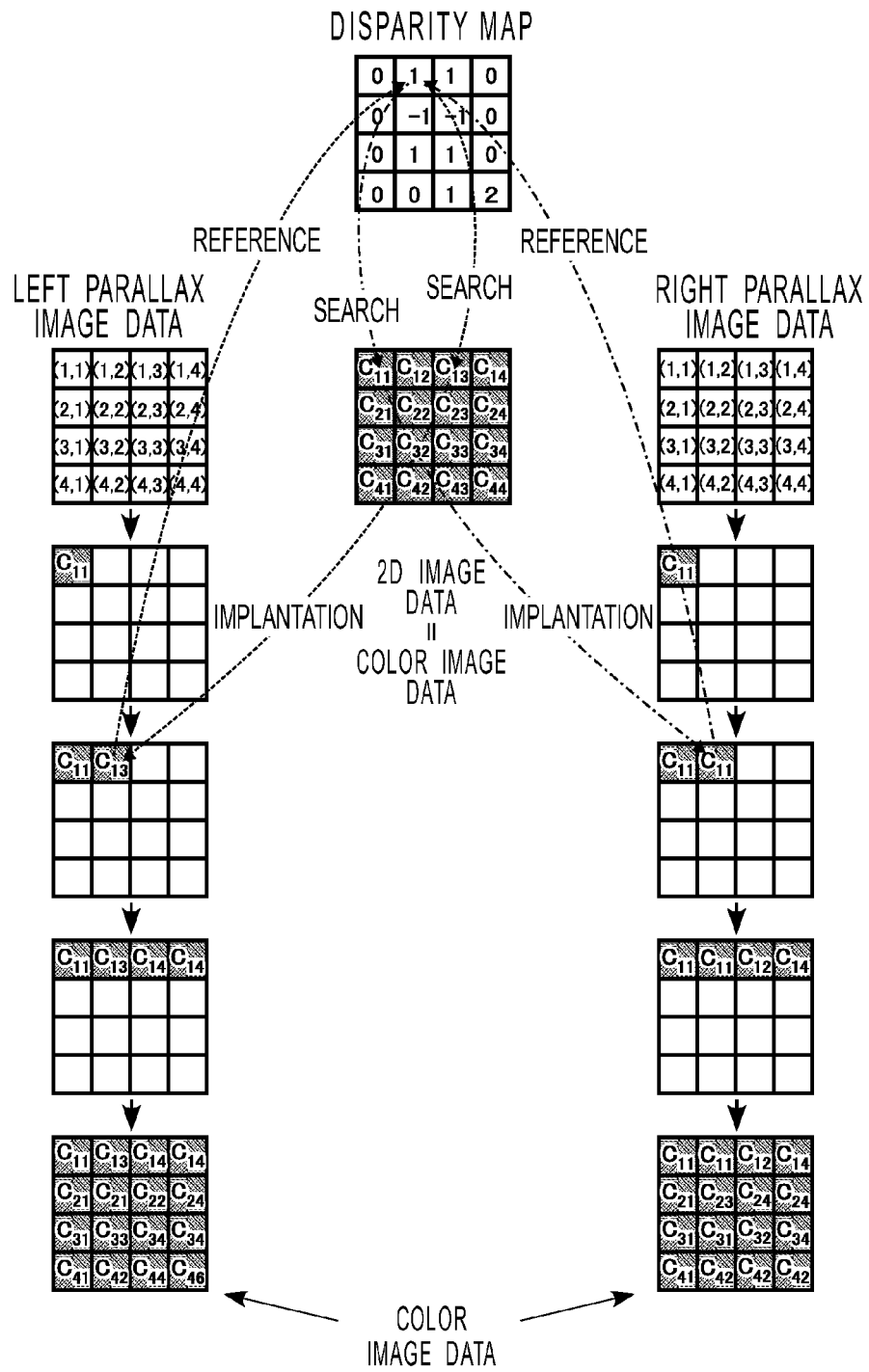
FIG. 21 is a conceptual diagram showing the process to implant primary color information by referring to a disparity map.

FIG. 21 is a conceptual diagram showing the process to implant primary color information by referring to a disparity map. Once the disparity map is generated using parallax image data as explained above, the image converting section 233 converts non-color image data to color image data by referring to the disparity map. For example, the following example assumes a case in which the 2D image data is color image data, and the parallax image data is non-color image data, which are among the image data generated as groups of image data.

The 2D image data, which serves as a reference image, has pixel values respectively corresponding to the RGB filters in each pixel block as primary color information. The primary color information corresponding to a pixel block (n, m) is represented as $C_{nm}$, assuming "n" and "m" to be natural numbers. The image converting section 233 implants the primary color formation $C_{n'm'}$ of a pixel block (n', m') of 2D image data as the primary color information of the pixel block (n, m) of parallax image data, by referring to the disparity map. The image converting section 233 repeats this operation to all the blocks, thereby converting the parallax image data, which is non-color image data, to color image data.

This is explained by referring to an example of the drawing. For obtaining the primary color information of a pixel block (1, 1) of the left parallax image data, the pixel block (1, 1) of the disparity map is referred to. Since the pixel block (1, 1) of the disparity map indicates the disparity pixel amount of 0, the image converting section 233 searches for a pixel block (1,1) of 2D image data as the corresponding pixel block. Then, by implanting the primary color information $C_{11}$ of the pixel block (1,1) of the 2D image data to the pixel block (1,1) of the left parallax image data, the image converting section 233 accordingly obtains the primary color information. Because the disparity pixel amount is 0, the primary color information $C_{11}$ of the pixel block (1, 1) of the 2D image data is implanted to the pixel block (1, 1) of the right parallax image data, too.

Next, for obtaining the primary color information of the pixel block (1, 2) of the left parallax image data, the pixel block (1, 2) of the disparity map is referred to. Since the pixel block (1, 2) of the disparity map indicates the disparity pixel amount of 1, the image converting section 233 searches for a pixel block (1,3), which is one block to the right of the corresponding pixel block (1, 2) of 2D image data. Then, by implanting the primary color information $C_{13}$ of the pixel block (1,3) of the 2D image data to the pixel block (1,2) of the left parallax image data, the image converting section 233 accordingly obtains the primary color information.

Next, the image converting section 233 obtains the primary color information of the pixel block (1, 2) of the right parallax image data. Although the disparity pixel amount of the pixel block (1, 2) of the disparity map referred to indicated 1, the sign should be reversed for implanting the primary color information to the right parallax pixel data. Therefore, the disparity pixel amount here is set to be −1. The image converting section 233 thus searches for a pixel block (1, 1), which is one block to the left of the corresponding pixel block (1, 2) of the 2D image data. Then, by implanting the primary color information $C_{11}$ of the pixel block (1,1) of the 2D image data to the pixel block (1,2) of the right parallax image data, the image converting section 233 accordingly obtains the primary color information.

To summarize, when the disparity pixel amount is "k", the image converting section 233 implants the primary color information $C_{nm+k}$ of the 2D image data to the pixel block (n, m) of the left parallax image data, and implants the primary color information $C_{nm-k}$ of the 2D image data to the pixel block (n, m) of the right parallax image data, thereby obtaining the primary information of each parallax image data. In this way, the primary color information is implanted to the entire blocks of the left parallax image data and the entire blocks of the right parallax image data, resulting in completion of color image data.

The example of FIG. 21 has dealt with implanting the primary color information when both pieces of parallax image data are non-color image data and the 2D image data is color image data. The case in which, among the image data group obtained by the data obtaining section 231, both pieces of parallax image data are non-color image data and the 2D image data is color image data corresponds to a case in which the image capturing element 100 is in a B-1 array and a B'-1 array, for example. Note that these arrays correspond to the repetitive pattern 110 composed of eight pixels made up of two longitudinal pixels and four lateral pixels. Therefore, for example when one block is constituted by four pixels composed of two longitudinal pixels and two lateral pixels (see FIG. 21 for example), the disparity amount operation section 232 may calculate the disparity pixel amount corresponding to each block for example by performing such processing as interpolating the lacking pixel values in the parallax image data, by the adjacent pixel values.

Contrary to the example of FIG. 21, when both pieces of parallax image data are color image data and the 2D image data is non-color image data, the image converting section 233 may implant the primary color information of the left parallax image data to the 2D image data by referring to the disparity map. It is needless to say that the primary color information of the right parallax image data can be implanted to the 2D image data, or such processing as averaging the primary color information of the left or right parallax image data can be performed in advance. In this regard, "implant" in this specification includes such a concept of implanting the pre-processed pixel values, and not limited to simply implanting the pixel values as they are. Here, the pixel values to be processed is not limited to the pixel values of the image data belonging to the targeted pixel values, but can also be data referring to the pixel values of the image data to be removed as a result of implantation. The processing is not limited to averaging, and may also be various types of digital filtering. The processing may also be varied depending on the disparity pixel amount, or depending on the characteristics of the subject image (e.g., a portion corresponding to the edge).

The case in which, among the image data group obtained by the data obtaining section 231, both pieces of parallax image data are color image data and the 2D image data is non-color image data corresponds to a case in which the image capturing element 100 is in a D-1 array, for example. The 2D image data that the data obtaining section 231 generates from the pixel output of the image capturing element 100 having a D-1 array has the pixel value of the Gr pixel. Therefore, for implanting the primary color information from parallax image data, the image converting section 233 may adjust the entire brightness value by comparing the pixel value of the G pixel to be used in implantation with the pixel value of the Gr pixel.

Figure 22:
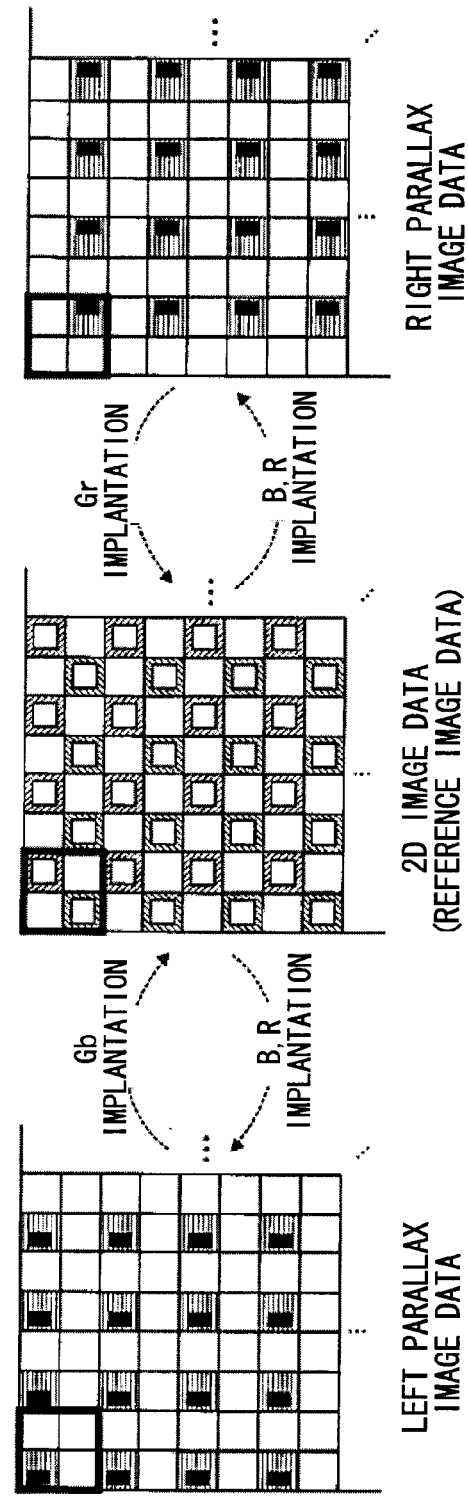
FIG. 22 is a conceptual diagram showing the process to implant primary color information for parallax image data and 2D image data alternately.

When both of the parallax image data and the 2D image data are non-color image data and not that one of them is color, it is still possible to change non-color image data into color image data by implantation. FIG. 22 is a conceptual diagram showing the process to implant primary color information for parallax image data and 2D image data alternately. The case in which, among the image data group obtained by the data obtaining section 231, both of the parallax image data and the 2D image data are non-color image data corresponds to a case in which the image capturing element 100 is in an A-1 array, for example.

In this case, the image converting section 233 implants the pixel values of the B pixel and the R pixel, which are primary color information of the 2D image data, to the left parallax image data and the right parallax image data, just as in the example of FIG. 21. In addition, the image converting section 233 implants some pixel of the left parallax image data to the pixel value of the Gb pixel from among the 2D image data, and some pixel of the right parallax image data to the pixel value of the Gr pixel, by referring to the disparity map. By mutually implanting the empty grids in this way, each image data is converted to color image data. When this processing is performed, it is preferable to equalize the area of the opening 104 of the parallax pixel and the area of the opening of the non-parallax pixel, from the view points such as amount of light and amount of blur.

The above explanation of the implantation of the primary color information was based on two pieces of parallax image data which are left parallax image data and right parallax image data. However, the similar processing can also be performed to a multiple number of pieces of parallax image data such as six pieces of parallax image data for example explained above referring to FIG. 5. In this case, the disparity amount operation section 232 generates a plurality of disparity maps taking into consideration the combination of corresponding left and right parallax image data.

The above explanation also dealt with a case in which the disparity pixel amount can be calculated in all the pixel blocks. However, there may be pixel blocks in which the disparity pixel amount cannot be calculated by matching due to the spatial frequency of the subject, occlusion, or the like. If such is the case, the disparity amount operation section 232 may perform interpolation taking into consideration the continuity of the pixel block to the adjacent pixel blocks in terms of disparity pixel amount. It is also possible that the disparity amount operation section 232 assume the disparity pixel amount of the uncalculated pixel block to be 0 for example, and the image processing section 205 correct the generated color image data.

Furthermore, even though the above explanation assumed the disparity pixel amount to be an integer, the disparity pixel amount calculated by matching may contain a fractional value. When the disparity pixel amount contains a fractional value, for calculating the primary color information at the central coordinates of the pixel block, the image converting section 233 may take weighted averages of respective pieces of primary color information having two disparity pixel amounts sandwiching the central coordinates according to the distance of them from the central coordinates, for example. The implantation of primary color information may not be performed for each pixel block. In an example, the image converting section 233 may perform image conversion by taking into consideration the difference between the central coordinates of the pixel block and the pixel position to which implantation is actually planned.

Also in the above explanation, the disparity amount operation section 232 calculated the disparity pixel amount for the same subject images based on the obtained image data. However, the amount to be obtained as a result of the operation is not limited to the disparity pixel amount, and may also be anything as long as it corresponds to the parallax between the same subject images. For example, the amount can be expressed in distance to correspond to a pixel pitch, or any scale in accordance with other standards may be adopted.

In addition, although explained as 2D image data, the reference image data may be any of the parallax image data when the image data group does not contain 2D image data for example.

In addition, each processing was explained above as a function of each constituting element of the digital camera 10, such as the data obtaining section 231, the disparity amount operation section 232, and the image converting section 233 included in the image processing section 205. On one hand, the control program for operating the control section 201 may operate each hardware component constituting the digital camera 10 as a constituting element for executing the above-explained processing.

In addition, in the above discussion, the digital camera 10 including the image capturing element 100 was explained to convert non-color image data to color image data. However, the conversion of non-color image data to color image data may also be conducted in other apparatuses (e.g., external personal computer) than the digital camera 10. In such a case, the apparatuses such as external personal computer can be regarded as an image processing apparatus. The image processing apparatus obtains an image data group containing reference image data and parallax image data for the same scene, any one of which is non-color image data, and converts the non-color image data to color image data.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. An image processing apparatus comprising:
   a processor configured to perform operations including:
      obtaining reference image data and parallax image data generated by image-capturing the same scene, the parallax image data having parallax with respect to a subject image of the reference image data and including right parallax image data that is shifted to a right direction with respect to the reference image data and left parallax image data that is shifted to a left direction with respect to the reference image data,
      calculating an amount of disparity that corresponds to parallax between the same subject images respectively of the reference image data and the parallax image data, and
      generating image data by implanting, based on the amount of disparity, at least a part of primary color information for generating a color image of the reference image data to different locations within an image for the right parallax image data and the left parallax image data.

2. The image processing apparatus according to claim 1, wherein the processor is further configured to:
   obtain an image data group including the reference image data and the parallax image data, at least one of the reference image data and the parallax image data being non-color image data lacking at least a part of the primary color information, and
   convert the non-color image data to color image data.

3. The image processing apparatus according to claim 2, wherein
   the first parallax image data and the second parallax image data are the non-color image data, and
   the processor is further configured to implant at least a part of the primary color information of the reference image data to the first parallax image data and the second parallax image data, thereby converting the first parallax image data and the second parallax image data to the color image data.

4. The image processing apparatus according to claim 3, wherein
   the first parallax image data and the second parallax image data are brightness image data that does not have the primary color information.

5. The image processing apparatus according to claim 2, wherein
   the reference image data is the non-color image data, and
   the processor is further configured to implant at least a part of the primary color information of at least one of the first parallax image data and the second parallax image data to the reference image data, thereby converting the reference image data to the color image data.

6. The image processing apparatus according to claim 2, wherein
   the reference image data, the first parallax image data, and the second parallax image data are the non-color image data, and
   the processor is further configured to implant at least a part of the primary color information of at least one of the first parallax image data and the second parallax image data to the reference image data, and implant at least a part of the primary color information of the reference image data to the first parallax image data and the second parallax image data, thereby converting the reference image data, the first parallax image data, and the second parallax image data to the color image data.

7. The image processing apparatus according to claim 2, wherein the processor is further configured to
   calculate a disparity amount between the reference image data and the first parallax image data, and a disparity amount between the reference image data and the second parallax image data, after calculating the disparity amount of the first parallax image data and the second parallax image data.

8. The image processing apparatus according to claim 2, wherein the processor is further configured to
   generate a disparity map representing the disparity amount of the first parallax image data and the second parallax image data with respect to the reference image data, and
   implant the primary color information by referring to the disparity map.

9. An image capturing apparatus comprising:
   an image capturing element that image-captures the same scene; and
   an image processing apparatus according to claim 1, wherein
   the processor is further configured to obtain the reference image data and the parallax image data by generating the reference image data and the parallax image data from a signal outputted from the image capturing element.

10. The image capturing apparatus according to claim 9, wherein
    the image capturing element includes:
    photoelectric conversion elements arranged two dimensionally, and photoelectric converting incident light to an electric signal;
    opening masks provided in a one-to-one relation to at least a part of the photoelectric conversion elements; and
    color filters provided in a one-to-one relation to at least a part of the photoelectric conversion elements, wherein
    openings of the opening masks provided to correspond to at least two of n (n being an integer equal to or greater than 3) photoelectric conversion elements adjacent to each other are included in one of color filter patterns including at least three types of the color filters transmitting respectively different wavelength regions, and are positioned to respectively transmit light fluxes from partial regions mutually different within a sectional region of the incident light, and the groups of photoelectric conversion elements, each made up of a set of n photoelectric conversion elements, are periodically arranged.

11. The image processing apparatus according to claim 1, wherein the processor is further configured to define, based on the amount of disparity, a location of an implanted area within an image when implanting the at least a part of primary color information.

12. The image processing apparatus according to claim 1, wherein the reference image data is image data without parallax.

13. An image processing apparatus comprising:
a processor configured to perform operations including:
obtaining an image data group including at least (i) reference image data generated by image capturing a scene, (ii) first parallax image data that is generated by image-capturing the same scene and that has the parallax in one direction with respect to the reference image data, and (iii) second parallax image data that is generated by image-capturing the same scene and that has parallax in another direction that is reverse to the one direction, the first and second parallax image data having parallax with respect to a subject image of the reference image data, and at least one of (i) the reference image data and (ii) the first and second parallax image data being non-color image data lacking at least a part of primary color information for generating a color image,
calculating disparity amounts that correspond to parallax between the same subject images respectively of the reference image data and the first and second parallax image data by, after calculating the disparity amount of the first parallax image data and the second parallax image data, calculating (i) the disparity amount between the reference image data and the first parallax image data and (ii) the disparity amount between the reference image data and the second parallax image data, and
converting the non-color image data to color image data by implanting at least a part of primary color information for generating a color image of one of the reference image data and the first and second parallax image data to the other of the reference image data and the first and second parallax image data based on the disparity amounts.

* * * * *